United States Patent
Li et al.

(10) Patent No.: US 12,185,529 B2
(45) Date of Patent: Dec. 31, 2024

(54) SEMICONDUCTOR DEVICE WITH PROGRAMMABLE STRUCTURE AND METHOD FOR FABRICATING THE SAME

(71) Applicant: NANYA TECHNOLOGY CORPORATION, New Taipei (TW)

(72) Inventors: Wei-Zhong Li, Taoyuan (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 365 days.

(21) Appl. No.: 17/678,407

(22) Filed: Feb. 23, 2022

(65) Prior Publication Data
US 2023/0269935 A1   Aug. 24, 2023

(51) Int. Cl.
*H10B 20/20* (2023.01)

(52) U.S. Cl.
CPC .................................. *H10B 20/20* (2023.02)

(58) Field of Classification Search
CPC ....... H01L 2924/18161; H01L 23/5386; H01L 2224/81; H01L 2224/32145; H01L 2924/1431; H01L 2224/13082; H01L 25/50; H01L 29/40114; H01L 27/1203; H01L 29/66825; H01L 2924/181; H01L 24/81; H01L 23/5252; H10B 20/20; H10B 20/25
See application file for complete search history.

(56) References Cited

U.S. PATENT DOCUMENTS

| | | | |
|---|---|---|---|
| 5,134,457 A * | 7/1992 | Hamdy | H01L 23/5252 |
| | | | 257/530 |
| 2005/0122768 A1 | 6/2005 | Fukumoto | |
| 2006/0097325 A1 | 5/2006 | Yang et al. | |
| 2013/0040408 A1 | 2/2013 | Nam et al. | |
| 2013/0059424 A1 | 3/2013 | Lindsay et al. | |
| 2015/0062998 A1 * | 3/2015 | Nam | H10B 20/25 |
| | | | 365/96 |
| 2016/0233333 A1 * | 8/2016 | Toh | H10N 50/01 |
| 2020/0083288 A1 * | 3/2020 | Kanaya | G11C 11/161 |
| 2021/0391342 A1 * | 12/2021 | Chang | H01L 23/5252 |

FOREIGN PATENT DOCUMENTS

TW   201545279 A   12/2015

* cited by examiner

*Primary Examiner* — Wasiul Haider

(57) ABSTRACT

The present application discloses a semiconductor device and a method for fabricating the semiconductor device. The semiconductor device includes a substrate; an isolation layer positioned in the substrate and defining an active area of the substrate, wherein the active area includes a transistor portion and a programmable portion extending from the transistor portion; a buried gate structure positioned in the transistor portion; a drain region positioned in the programmable portion and the transistor portion, and adjacent to the gate structure; a source region positioned in the transistor portion, adjacent to the gate structure, and opposite to the drain region with the buried gate structure interposed therebetween; a middle insulating layer positioned on the programmable portion; and an upper conductive layer positioned on the middle insulating layer. The drain region in the programmable portion, the middle insulating layer, and the upper conductive layer together configure a programmable structure.

11 Claims, 53 Drawing Sheets

SEMICONDUCTOR DEVICE WITH PROGRAMMABLE STRUCTURE AND METHOD FOR FABRICATING THE SAME

TECHNICAL FIELD

The present disclosure relates to a semiconductor device and a method for fabricating the semiconductor device, and more particularly, to a semiconductor device with a programmable structure and a method for fabricating the semiconductor device with the programmable structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; an isolation layer positioned in the substrate and defining an active area of the substrate, wherein the active area includes a transistor portion and a programmable portion extending from the transistor portion; a gate structure positioned on the transistor portion; a drain region positioned in the programmable portion and the transistor portion, and adjacent to the gate structure; a source region positioned in the transistor portion, adjacent to the gate structure, and opposite to the drain region with the gate structure interposed therebetween; a middle insulating layer positioned on the programmable portion; and an upper conductive layer positioned on the middle insulating layer. The drain region in the programmable portion, the middle insulating layer, and the upper conductive layer together configure a programmable structure.

Another aspect of the present disclosure provides a semiconductor device including a substrate; an isolation layer positioned in the substrate and defining an active area of the substrate, wherein the active area includes a transistor portion and a programmable portion extending from the transistor portion; a buried gate structure positioned in the transistor portion; a drain region positioned in the programmable portion and the transistor portion, and adjacent to the gate structure; a source region positioned in the transistor portion, adjacent to the gate structure, and opposite to the drain region with the buried gate structure interposed therebetween; a middle insulating layer positioned on the programmable portion; and an upper conductive layer positioned on the middle insulating layer. The drain region in the programmable portion, the middle insulating layer, and the upper conductive layer together configure a programmable structure.

Another aspect of the present disclosure provides a method for fabricating a semiconductor device including providing a substrate; forming an isolation layer in the substrate to define an active area of the substrate, wherein the active area includes a transistor portion and a programmable portion extending from the transistor portion; forming a gate structure on the transistor portion; forming a drain region in the programmable portion and the transistor portion, and adjacent to the gate structure; forming a source region in the transistor portion, adjacent to the gate structure, and opposite to the drain region; forming a middle insulating layer on the programmable portion; and forming an upper conductive layer on the middle insulating layer. The drain region in the programmable portion, the middle insulating layer, and the upper conductive layer together configure a programmable structure.

Another aspect of the present disclosure provides a method for fabricating a semiconductor device including providing a substrate; forming an isolation layer in the substrate to define an active area of the substrate, wherein the active area includes a transistor portion and a programmable portion extending from the transistor portion; forming a buried gate structure in the transistor portion; forming a drain region in the programmable portion and the transistor portion, and adjacent to the gate structure; forming a source region in the transistor portion, adjacent to the gate structure, and opposite to the drain region; forming a middle insulating layer on the programmable portion; and forming an upper conductive layer on the middle insulating layer. The drain region in the programmable portion, the middle insulating layer, and the upper conductive layer together configure a programmable structure.

Due to the design of the semiconductor device of the present disclosure, the programmable structure integrates the drain region associated with the gate structure as the lower conductor of the programmable structure so that the occupied area of the programmable structure may be reduced. Therefore, more area may be available for other sophisticated functional units or more programmable structures. As a result, the performance of the semiconductor device may be improved. In addition, the gate structure associated with the programmable structure may also serve as an isolation transistor to isolate the high programming voltage to adjacent elements. Therefore, the damage to the adjacent elements by the high programming voltage (e.g., the leakage current originated from the high programming voltage) may be reduced. The reliability of the semiconductor device may be improved, accordingly.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
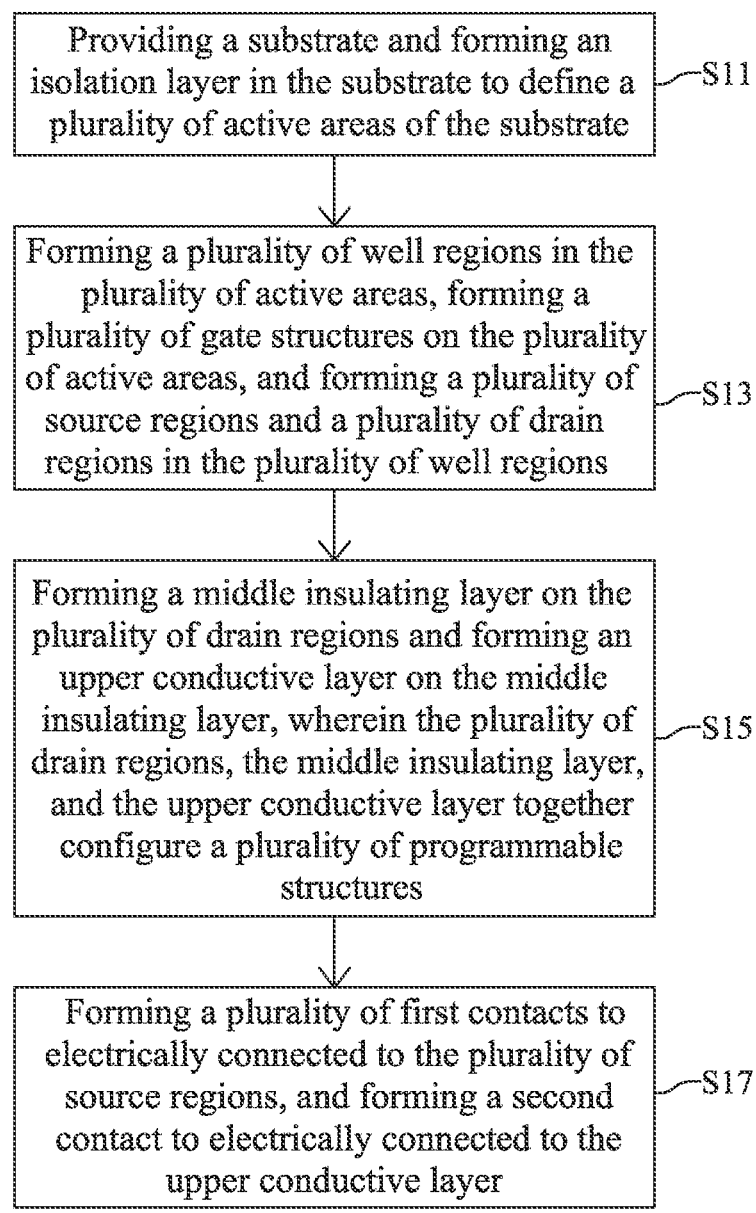
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or features) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above for up) corresponds to the direction of the arrow of the direction Z, and below (or down) corresponds to the opposite direction of the arrow of the direction Z.

Figure 2:
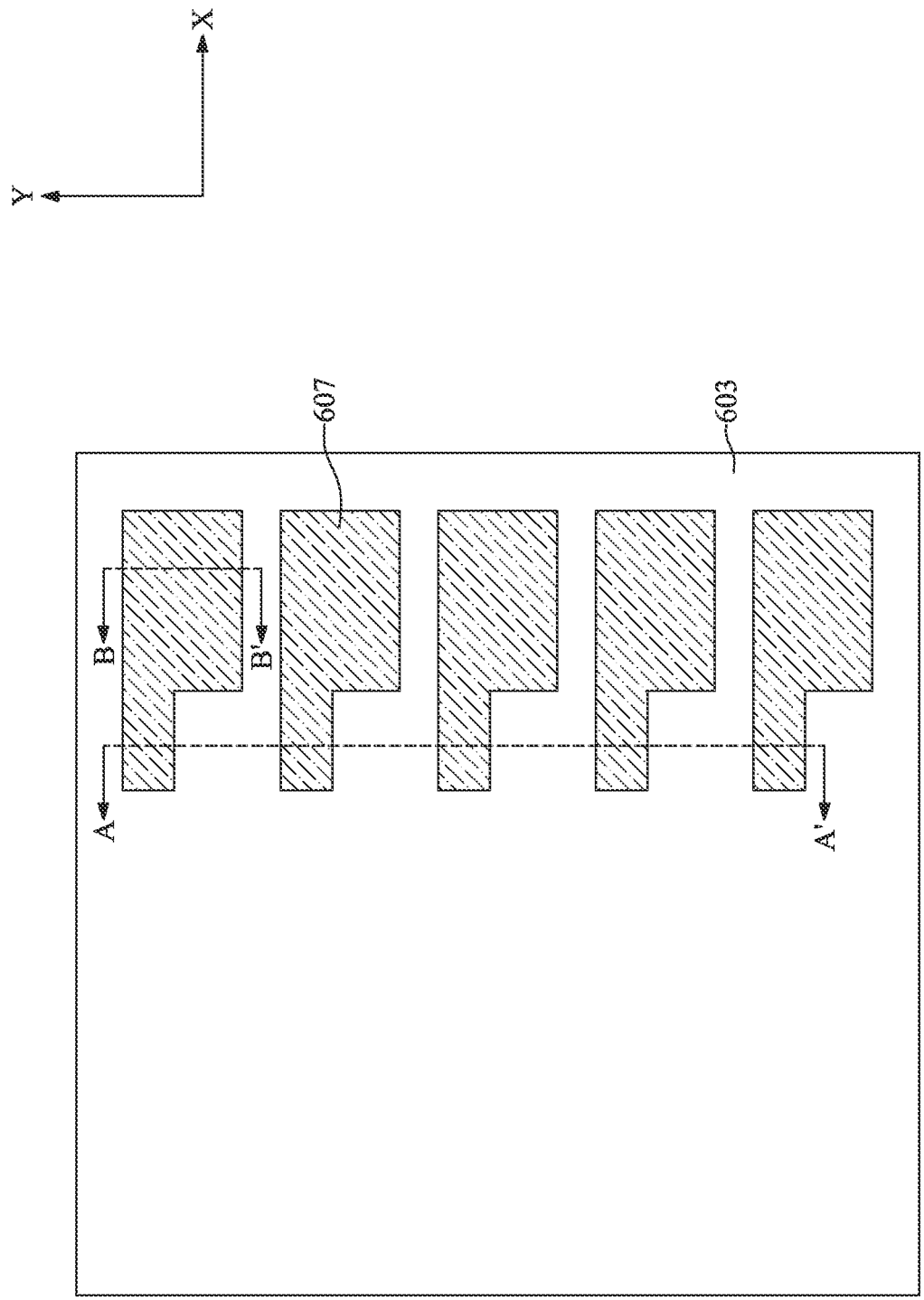
FIG. 2 illustrates, in a schematic top-view diagram, an intermediate semiconductor device in accordance with one embodiment of the present disclosure.
Figure 7:
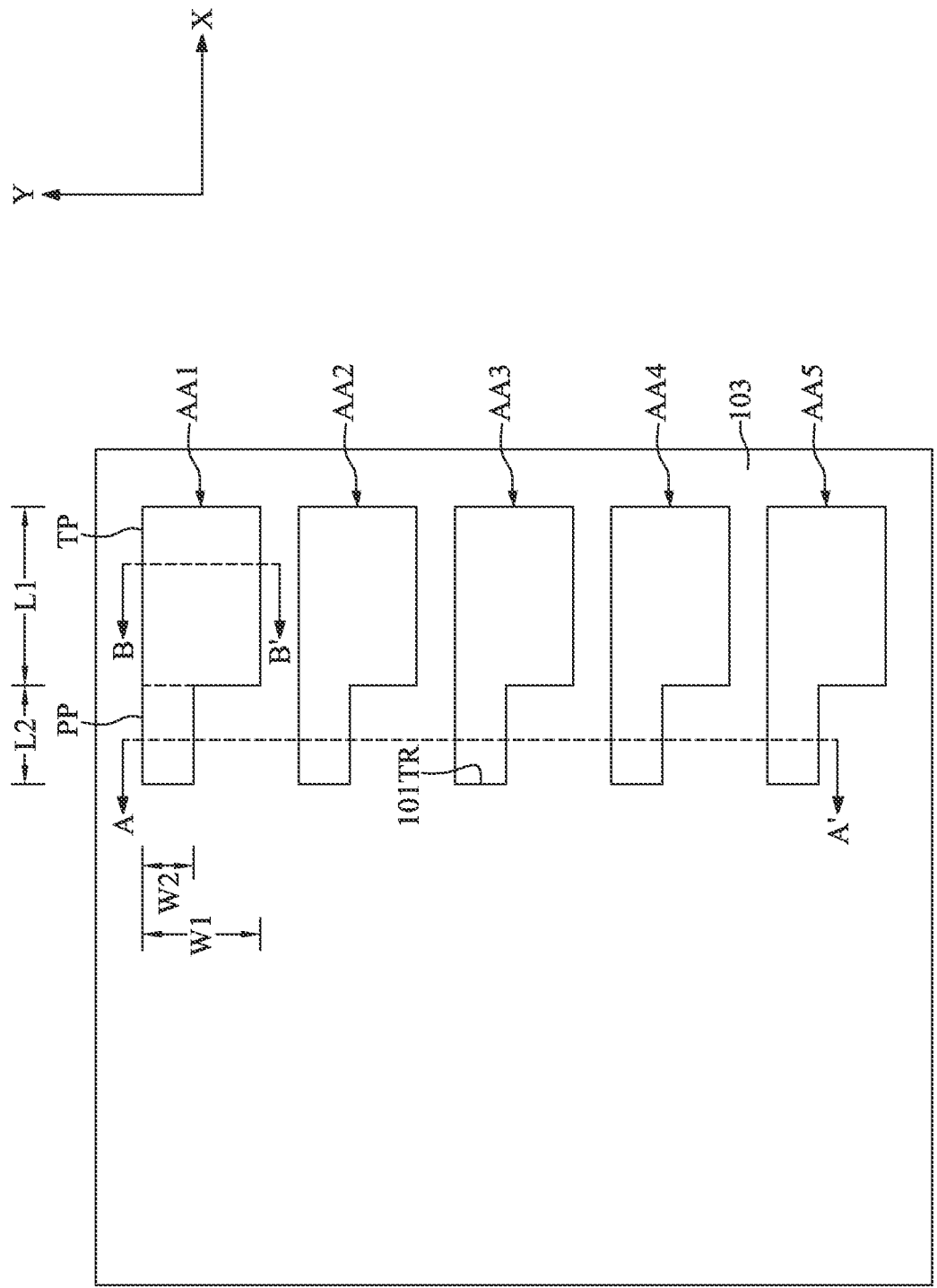
FIG. 7 illustrates, in a schematic top-view diagram, an intermediate semiconductor device in accordance with one embodiment of the present disclosure.
Figure 8:
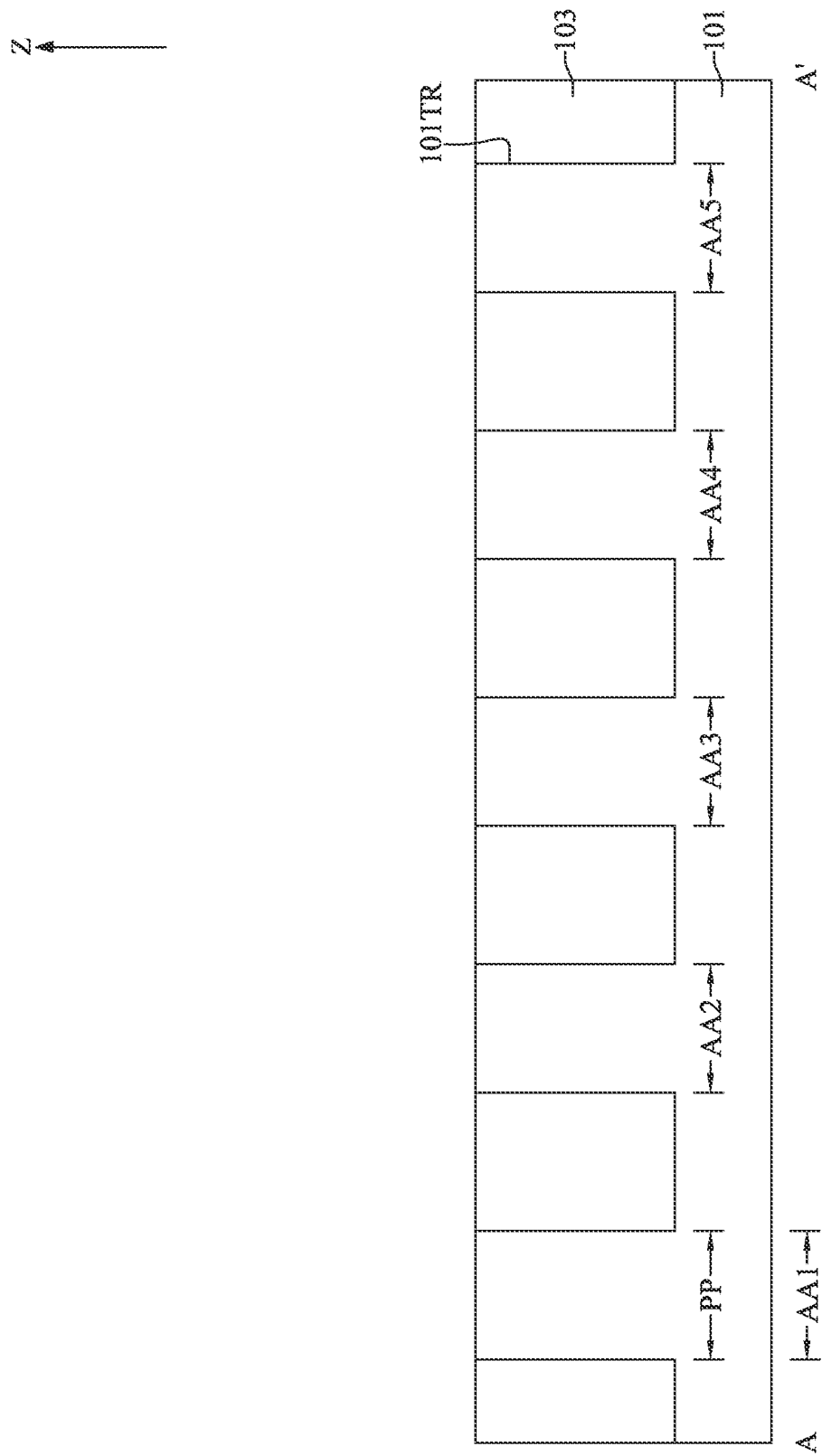
FIGS. 8 to 11 are schematic cross-sectional view diagrams taken along the line A-A' and the line B-B' in FIG. 7 illustrating part of the flow for fabricating the semiconductor device in accordance with one embodiment of the present disclosure.
Figure 9:
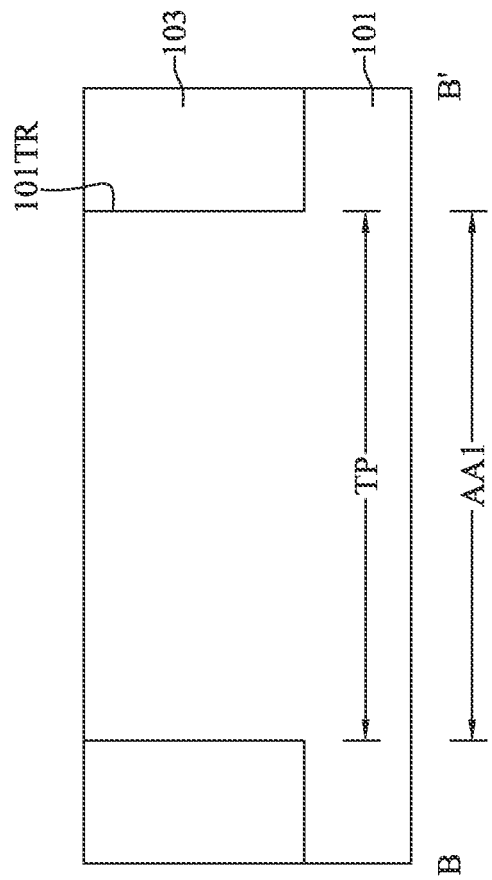

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIGS. 3 to 6 are schematic cross-sectional view diagrams taken along the line A-A' and the line B-B' in FIG. 2 illustrating part of a flow for fabricating the semiconductor device 1A in accordance with one embodiment of the present disclosure. FIG. 7 illustrates, in a schematic top-view diagram, an intermediate semiconductor device in accordance with one embodiment of the present disclosure. FIGS. 8 and 9 are schematic cross-sectional view diagrams taken along the line A-A' and the line B-B' in FIG. 7 illustrating part of the flow for fabricating the semiconductor device 1A in accordance with one embodiment of the present disclosure.

With reference to FIGS. 1 to 9, at step S11, a substrate 101 may be provided, and an isolation layer 103 may be formed in the substrate 101 to define a plurality of active areas AA1, AA2, AA3, AA4, AA5 of the substrate 101.

Figure 3:
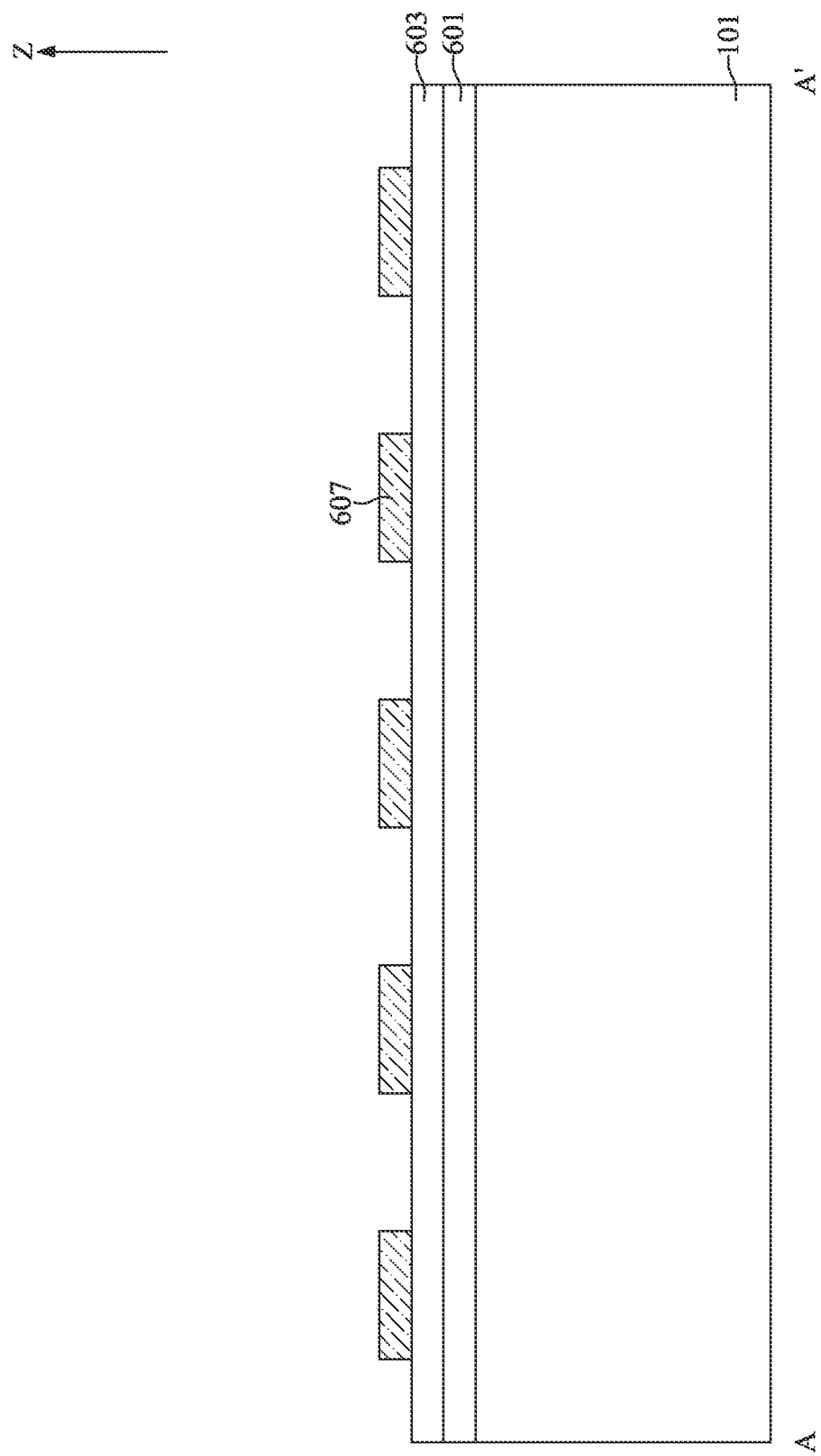
FIGS. 3 to 6 are schematic cross-sectional view diagrams taken along the line A-A' and the line B-B' in FIG. 2 illustrating part of a flow for fabricating the semiconductor device in accordance with one embodiment of the present disclosure.
Figure 4:
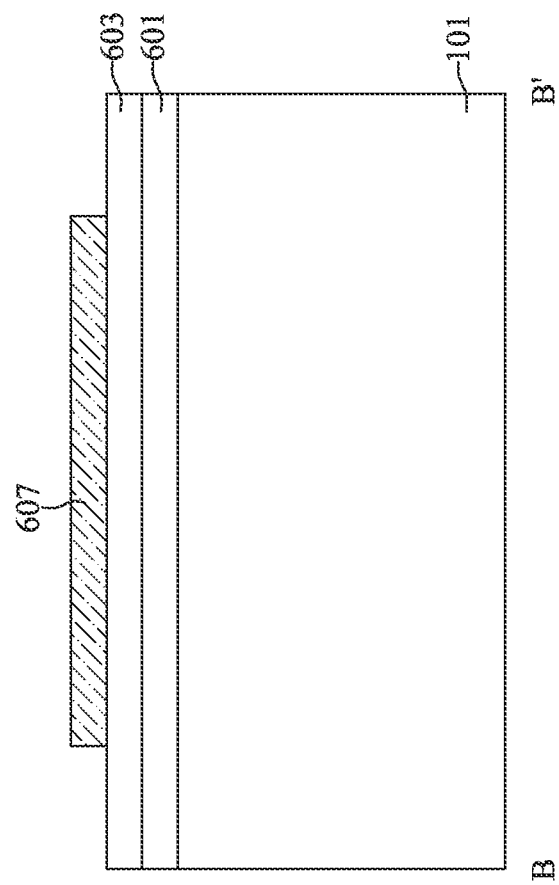

With reference to FIGS. 2 to 4, the substrate 101 may include a silicon-containing material. Illustrative examples of silicon-containing materials suitable for the substrate 101 may include, but are not limited to, silicon, silicon germanium, carbon doped silicon germanium, silicon germanium carbide, carbon-doped silicon, silicon carbide, and multi-layers thereof. Although silicon is the predominantly used semiconductor material in wafer fabrication, in some embodiments, alternative semiconductor materials can be employed as additional layers, such as, but not limited to, germanium, gallium arsenide, gallium nitride, silicon germanium, cadmium telluride, zinc selenide, germanium tin, etc.

With reference to FIGS. 2 to 4, a series of deposition processes may be performed to deposit a pad oxide layer 601 and a pad nitride layer 603 on the substrate 101. A photolithography process may be performed to define the position of the isolation layer 103 by forming a first mask layer 607 on the pad nitride layer 603.

Figure 5:
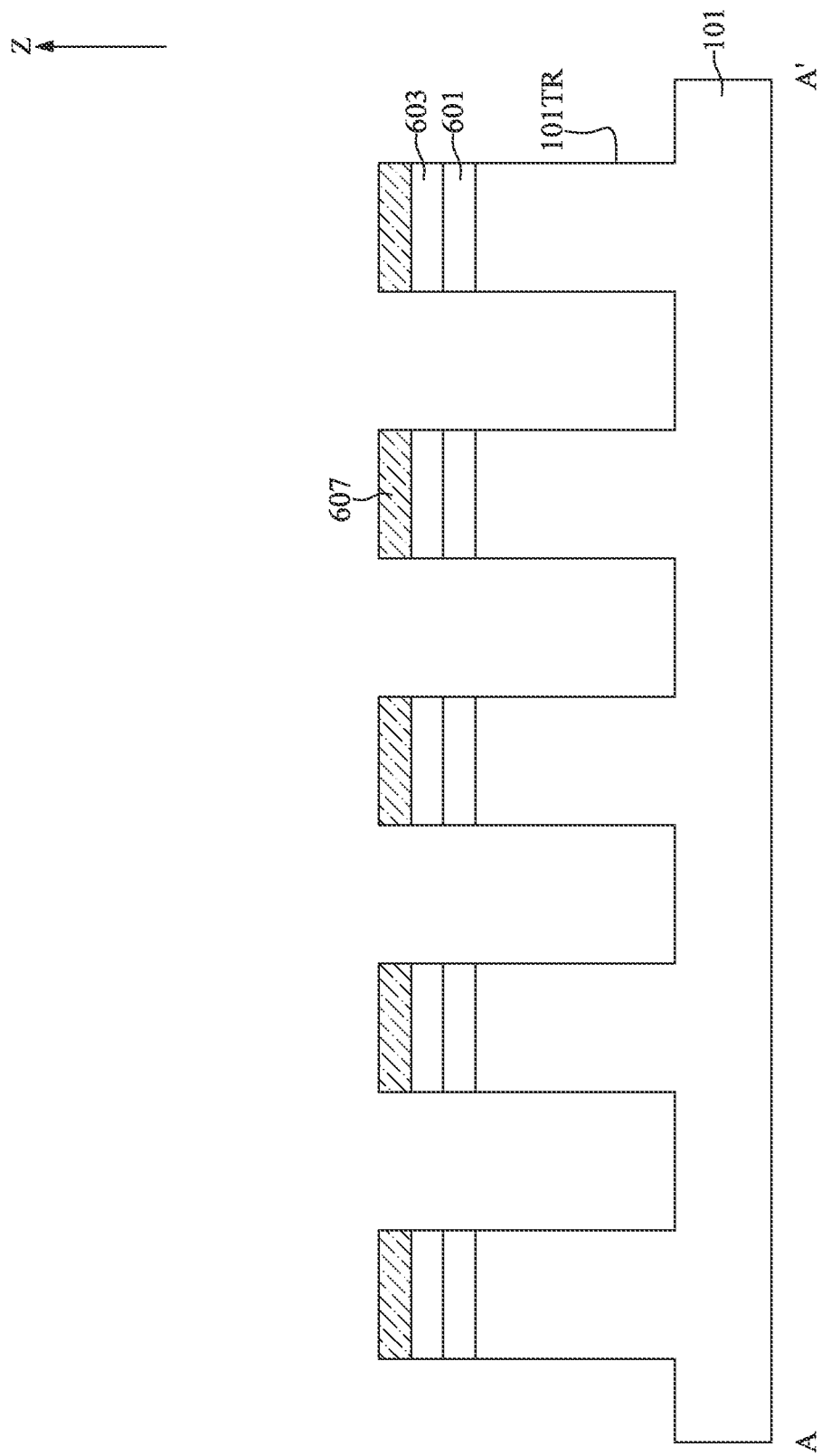
Figure 6:
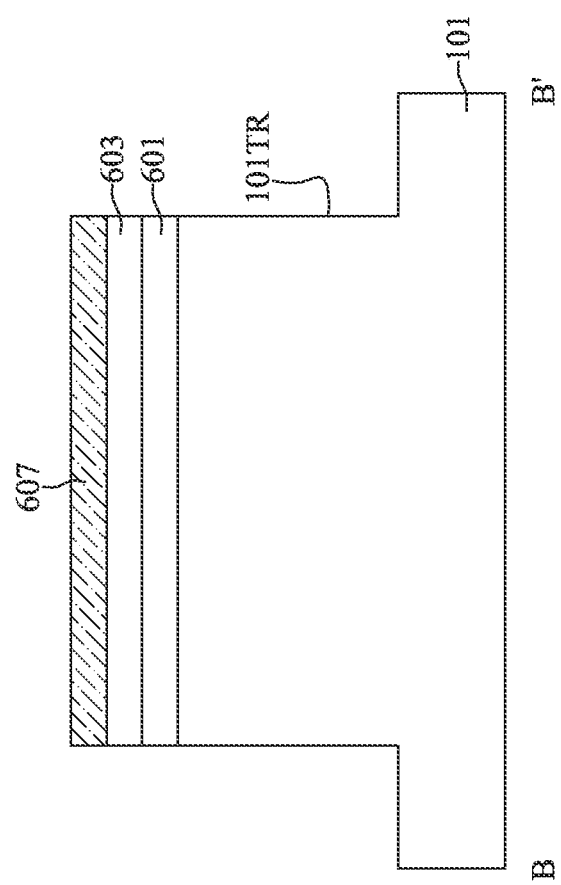

With reference to FIGS. 5 and 6, after the photolithography process, an etch process, such as an anisotropic dry etch process, may be performed to form a first trench 101TR penetrating along the pad nitride layer 603 and the pad oxide layer 601, and extending to the substrate 101.

With reference to FIGS. 7 to 9, an insulating material may be deposited into the first trench 101TR and a planarization process, such as chemical mechanical polishing, may be subsequently performed to remove excess filling material until the top surface of the substrate 101 is exposed so as to form the isolation layer 103. The top surface of the isolation layer 103 and the top surface of the substrate 101 may be substantially coplanar. The insulating material may be, for example, silicon oxide, silicon nitride, silicon oxynitride, silicon nitride oxide, or fluoride-doped silicate. It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 7 to 9, the portions of the substrate 101 surrounded by the isolation layer 103 may be referred to as the active areas AA1, AA2, AA3, AA5. In some embodiments, the active areas AA1, AA2, AA3, AA4, AA5 may be arranged along the direction Y in a top-view perspective. For brevity, clarity, and convenience of description, only one active area AA1 is described. The active area AA1 may include a transistor portion TP and a programmable portion PP.

In some embodiments, in a top-view perspective, the transistor portion TP may have a rectangular profile and the transistor portion TP may extend along the direction X. The programmable portion PP may have a line-shaped profile and may extend from the transistor portion TP. The programmable portion PP may extend along the direction X. The width W1 of the transistor portion TP is greater than the width W2 of the programmable portion PP.

In some embodiments, in a top-view perspective, the upper side of the programmable portion PP and the upper side of the transistor portion TP are aligned with each other but is not limited thereto.

In some embodiments, in a top-view perspective, the length L1 of the transistor portion TP is greater than or equal to the length L2 of the programmable portion PP.

Figure 10:
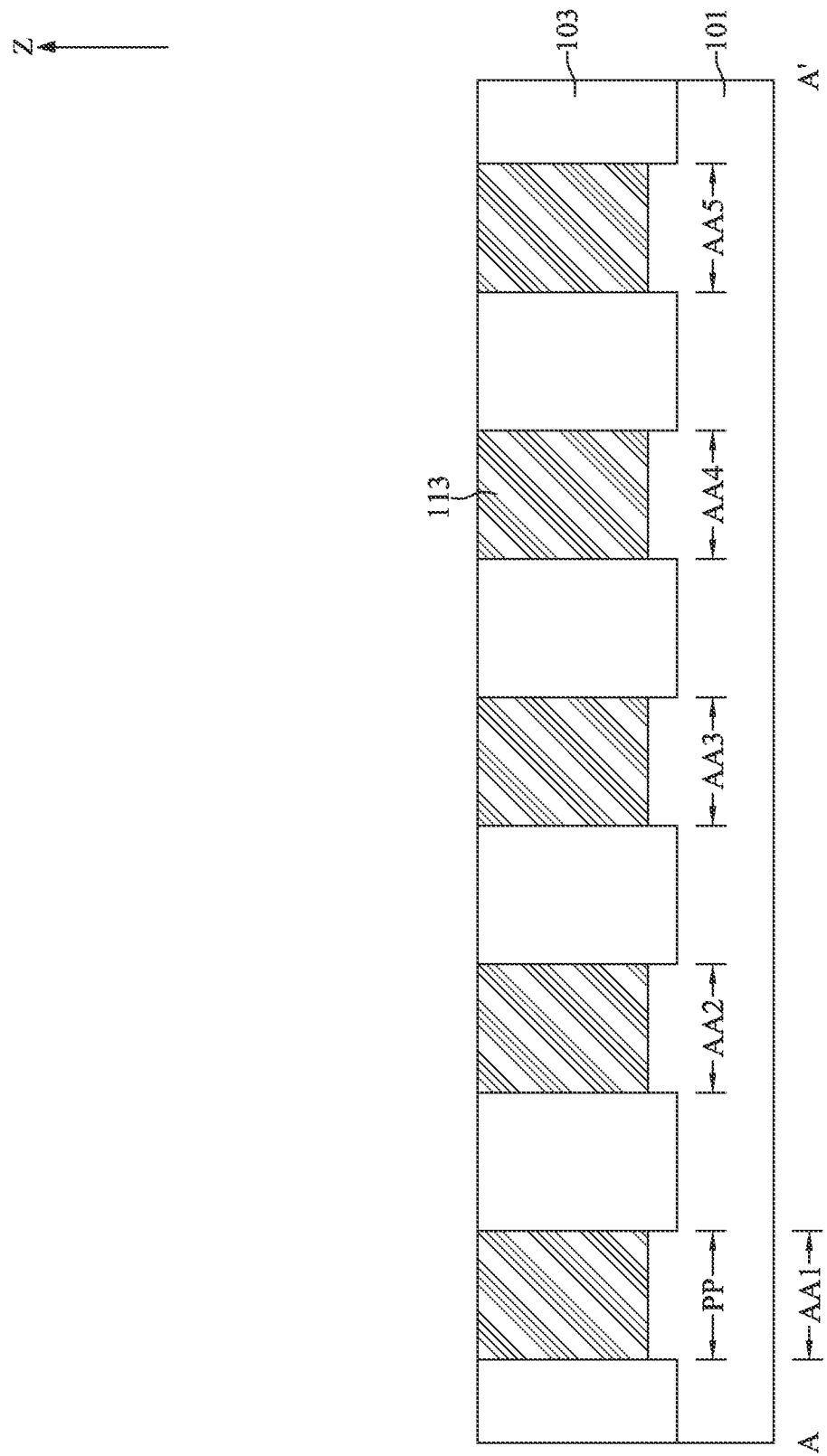
Figure 11:
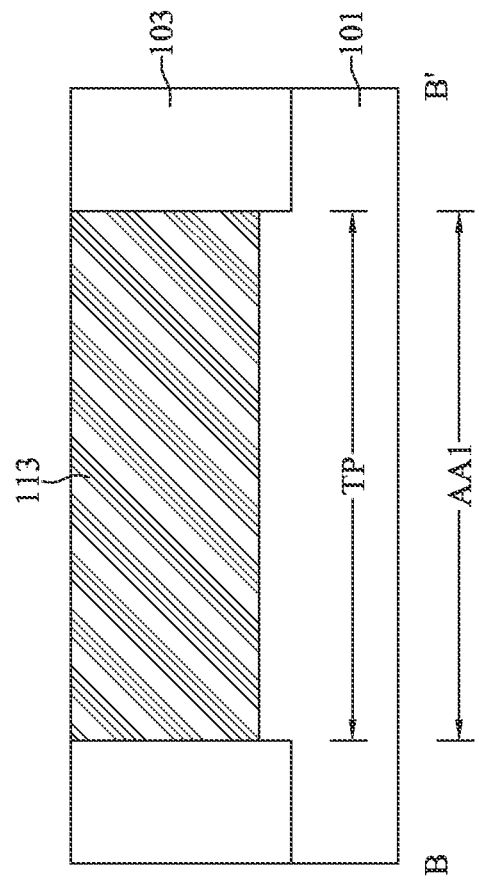
Figure 12:
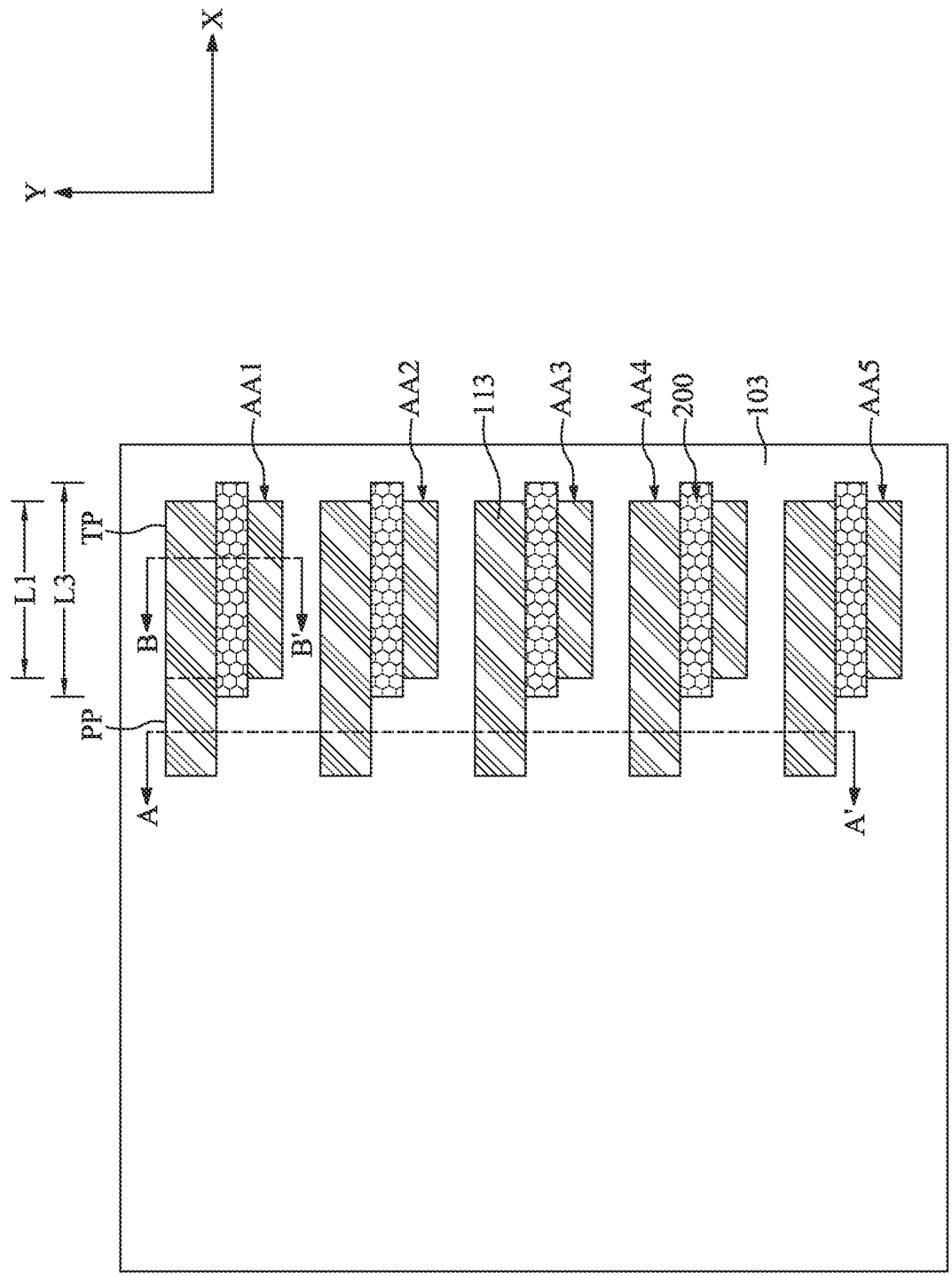
FIG. 12 illustrates, in a schematic top-view diagram, an intermediate semiconductor device in accordance with one embodiment of the present disclosure.
Figure 13:
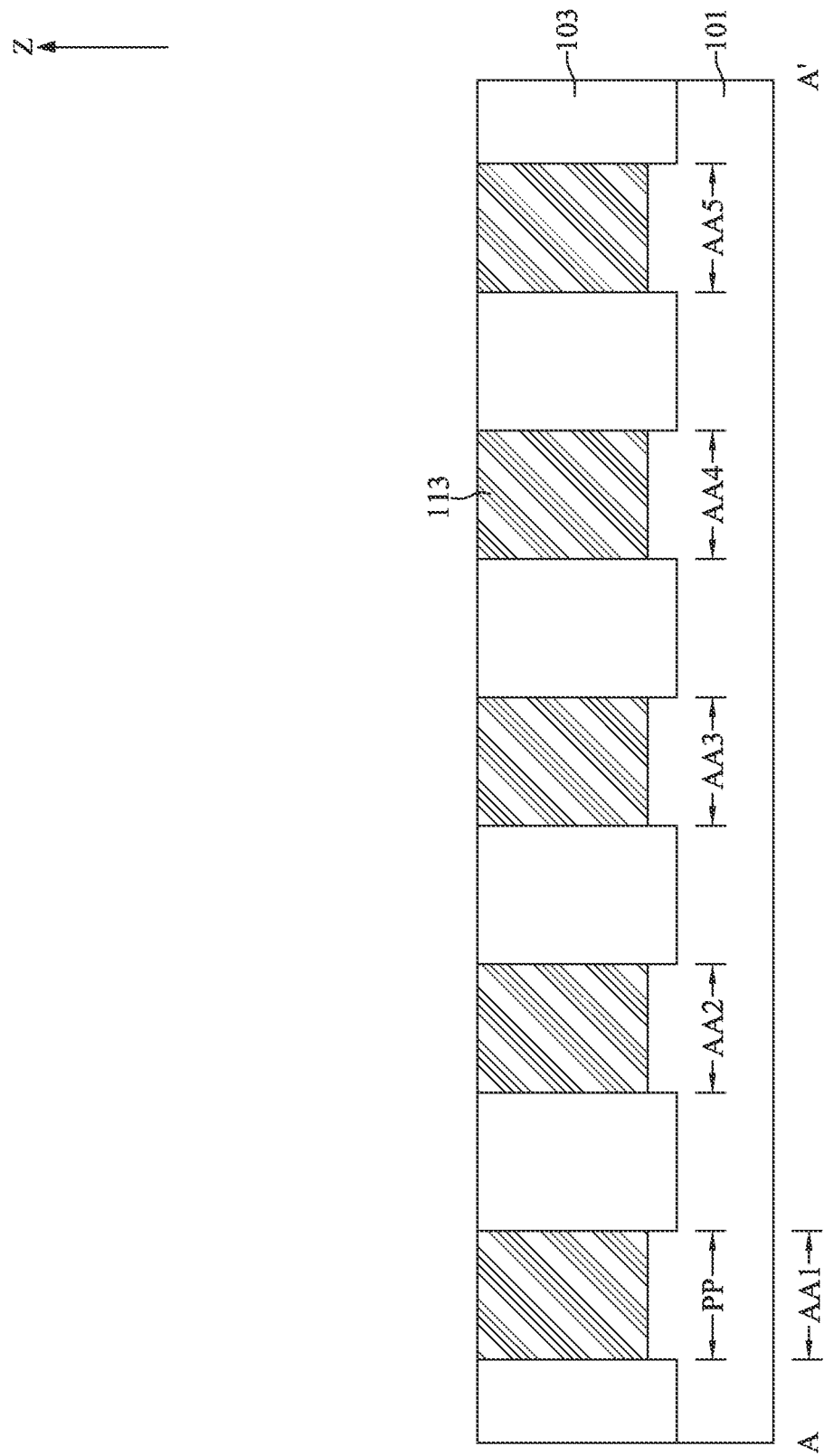
FIGS. 13 and 14 are schematic cross-sectional view diagrams taken along the line A-A' and the line 13-13' in FIG. 12 illustrating part of the flow for fabricating the semiconductor device in accordance with one embodiment of the present disclosure.
Figure 14:
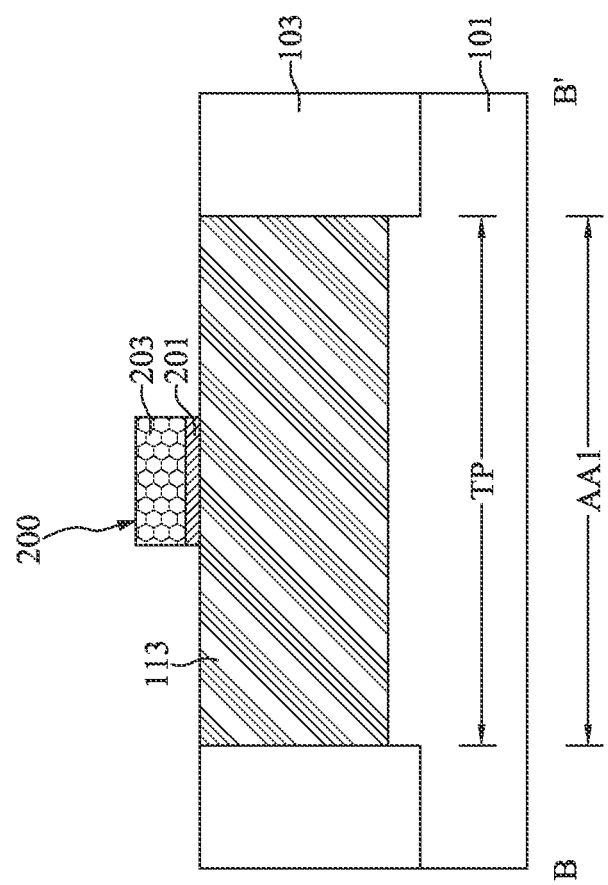

FIGS. 10 and 11 are schematic cross-sectional view diagrams taken along the line A-A' and the line B-B' in FIG. 7 illustrating part of the flow for fabricating the semiconductor device 1A in accordance with one embodiment of the present disclosure. FIG. 12 illustrates, in a schematic top-view diagram, an intermediate semiconductor device in accordance with one embodiment of the present disclosure. FIGS. 13 and 14 are schematic cross-sectional view diagrams taken along the line A-A' and the line B-B' in FIG. 12 illustrating part of the flow for fabricating the semiconductor device 1A in accordance with one embodiment of the present disclosure.

Figure 15:
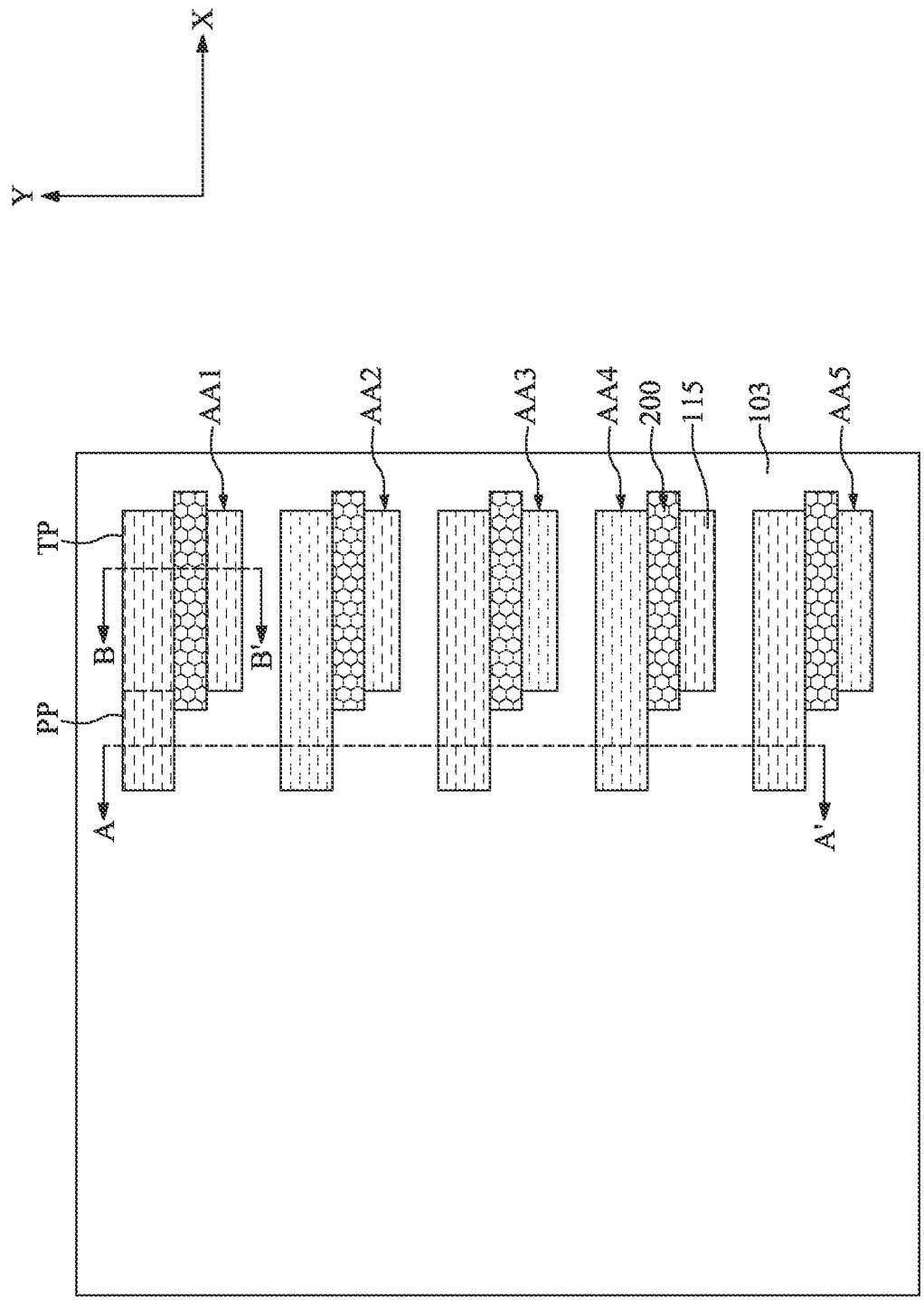
FIG. 15 illustrates, in a schematic top-view diagram, an intermediate semiconductor device in accordance with one embodiment of the present disclosure.
Figure 22:
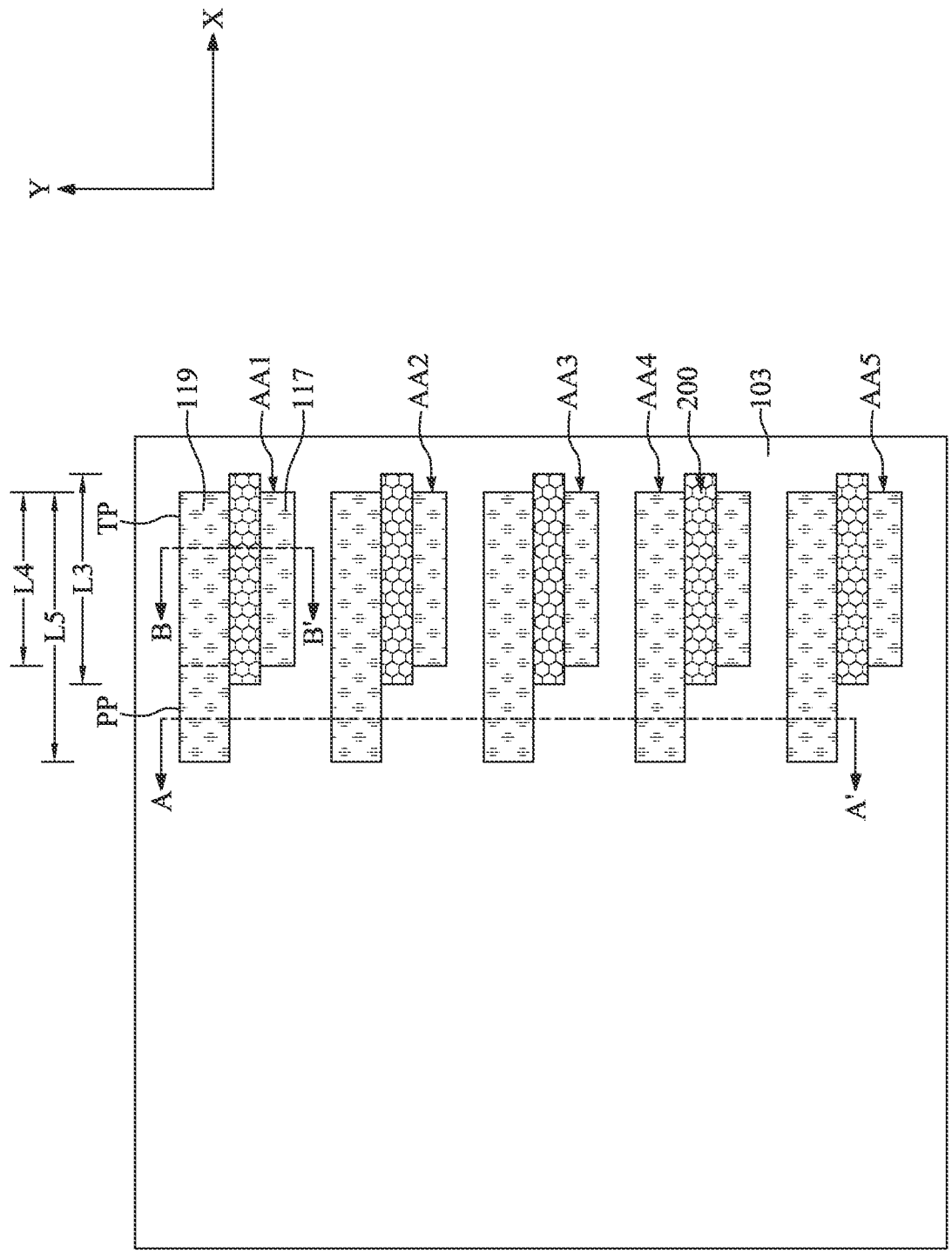
FIG. 22 illustrates, in a schematic top-view diagram, an intermediate semiconductor device in accordance with one embodiment of the present disclosure.
Figure 23:
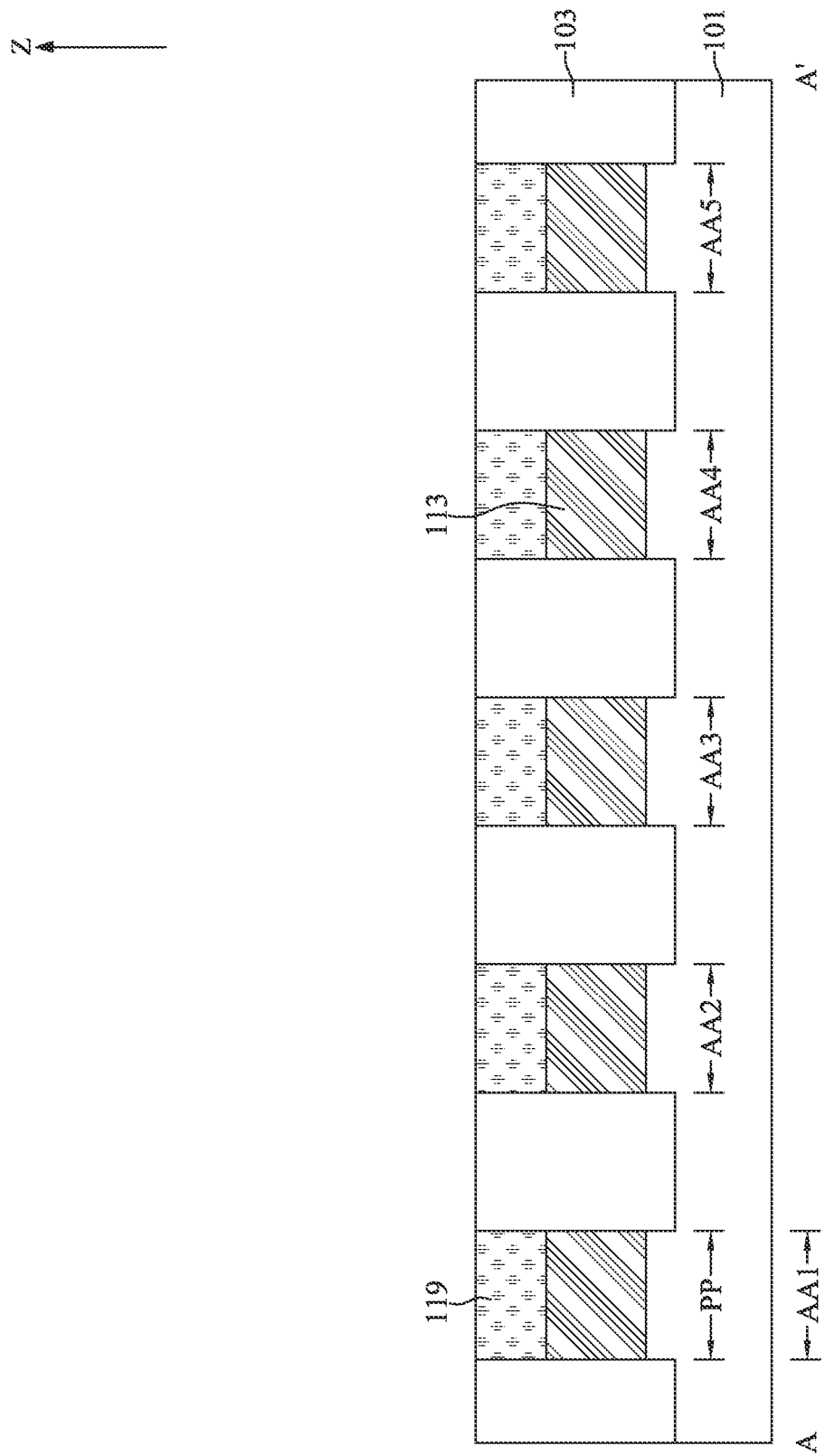
FIGS. 23 and 24 are schematic cross-sectional view diagrams taken along the line A-A' and the line B-B' in FIG. 22 illustrating part of the flow for fabricating the semiconductor device in accordance with one embodiment of the present disclosure.
Figure 24:
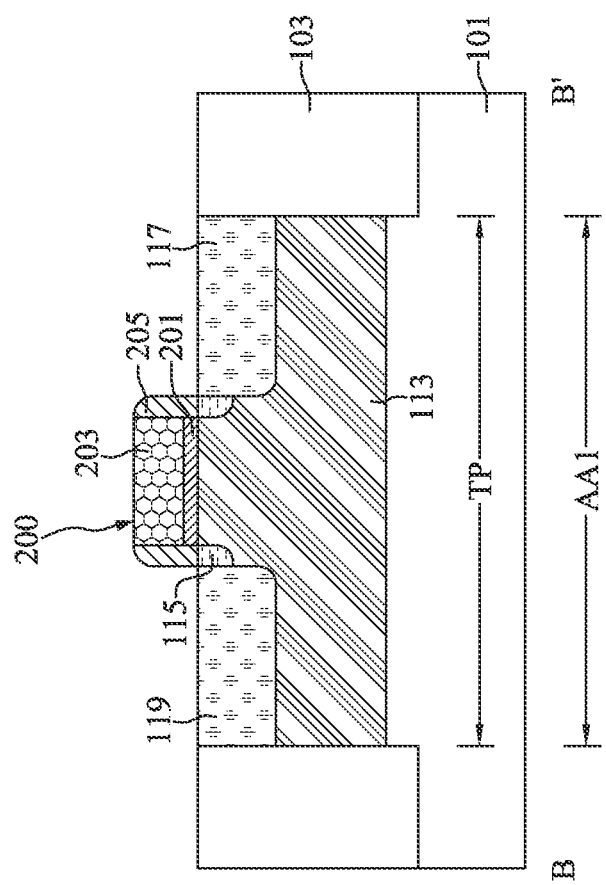

FIG. 15 illustrates, in a schematic top-view diagram, an intermediate semiconductor device in accordance with one embodiment of the present disclosure. FIGS. 16 to 21 are schematic cross-sectional view diagrams taken along the line A-A' and the line B-B' in FIG. 15 illustrating part of the flow for fabricating the semiconductor device 1A in accordance with one embodiment of the present disclosure. FIG. 22 illustrates, in a schematic top-view diagram, an intermediate semiconductor device in accordance with one embodiment of the present disclosure. FIGS. 23 and 24 are schematic cross-sectional view diagrams taken along the line A-A' and the line B-B' in FIG. 22 illustrating part of the flow for fabricating the semiconductor device 1A in accordance with one embodiment of the present disclosure.

With reference to FIG. 1 and FIGS. 10 to 24, at step S13, a plurality of well regions 113 may be formed in the plurality of active areas AA1, AA2, AA3, AA4, AA5, a plurality of gate structures 200 may be formed on the plurality of active areas AA1, AA2, AA3, AA4, AA5, and a plurality of source regions 117 and a plurality of drain regions 119 may be formed in the plurality of well regions 113.

With reference to FIGS. 10 and 11, in some embodiments, an p-type impurity implant process may be performed to form the well regions 113 in the active areas AA1, AA2, AA3, AA4, AA5, respectively and correspondingly. The p-type impurity implant process may add impurities to an intrinsic semiconductor that creates deficiencies of valence electrons. In a silicon-containing substrate, examples of p-type dopants, i.e., impurities include but are not limited to boron, aluminum, gallium, or indium. In some embodiments, the well regions 113 may have the first electrical type (i.e., the p-type).

For brevity, clarity, and convenience of description, only one gate structure 200 is described.

With reference to FIGS. 12 to 14, the gate structure 200 may be formed on the transistor portion TP of the active area AA1. It should be noted that, the gate structure 200 is not overlapped with the programmable portion PP of the active area AA1 in a top-view perspective. In some embodiments, in a top-view perspective, the length L3 of the gate structure 200 may be greater than or equal to the length L1 of the transistor portion TP of the active area AA1.

In some embodiments, in a top-view perspective, the gate structure 200 may extend along the direction X and divide the transistor portion TP of the active area AA1 into an upper part and a lower part. In the present embodiment, the programmable portion PP may extend from the upper part from the upper part of the transistor portion TP.

With reference to FIGS. 12 to 14, the gate structure 200 may include a gate insulating layer 201 and a gate conductive layer 203. The gate insulating layer 201 may be formed on the transistor portion TP of the active area AA1. In some embodiments, the thickness of the gate insulating layer 201 may be about 50 angstroms or less than 50 angstroms.

In some embodiments, the gate insulating layer 201 may be formed of for example, silicon oxide. In some embodiments, the gate insulating layer 201 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof.

Illustrative examples of high-k dielectric material may include, but are not limited to, hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof.

In some embodiments, the gate insulating layer 201 may be a multilayer structure that includes, for example, one layer of silicon oxide and another layer of high-k dielectric material.

With reference to FIGS. 12 to 14, the gate conductive layer 203 may be formed on the gate insulating layer 201. In some embodiments, the gate conductive layer 203 may be formed of, for example, (doped) polycrystalline silicon, (doped) polycrystalline germanium, (doped) polycrystalline silicon germanium, or other suitable conductive material.

Figure 16:
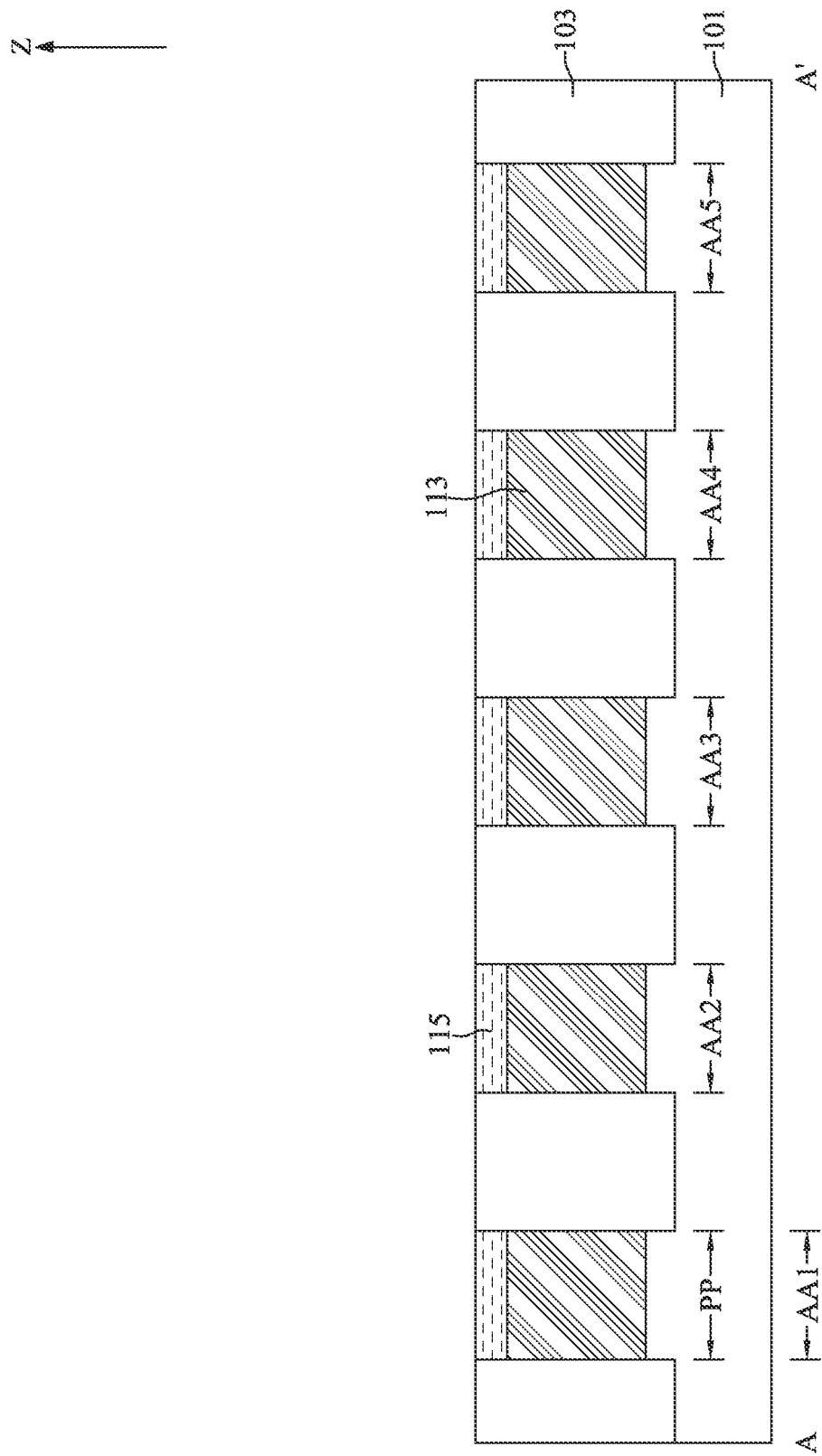
FIGS. 16 to 21 are schematic cross-sectional view diagrams taken along the line A-A' and the line B-B' in FIG. 15 illustrating part of the flow for fabricating the semiconductor device in accordance with one embodiment of the present disclosure.
Figure 17:
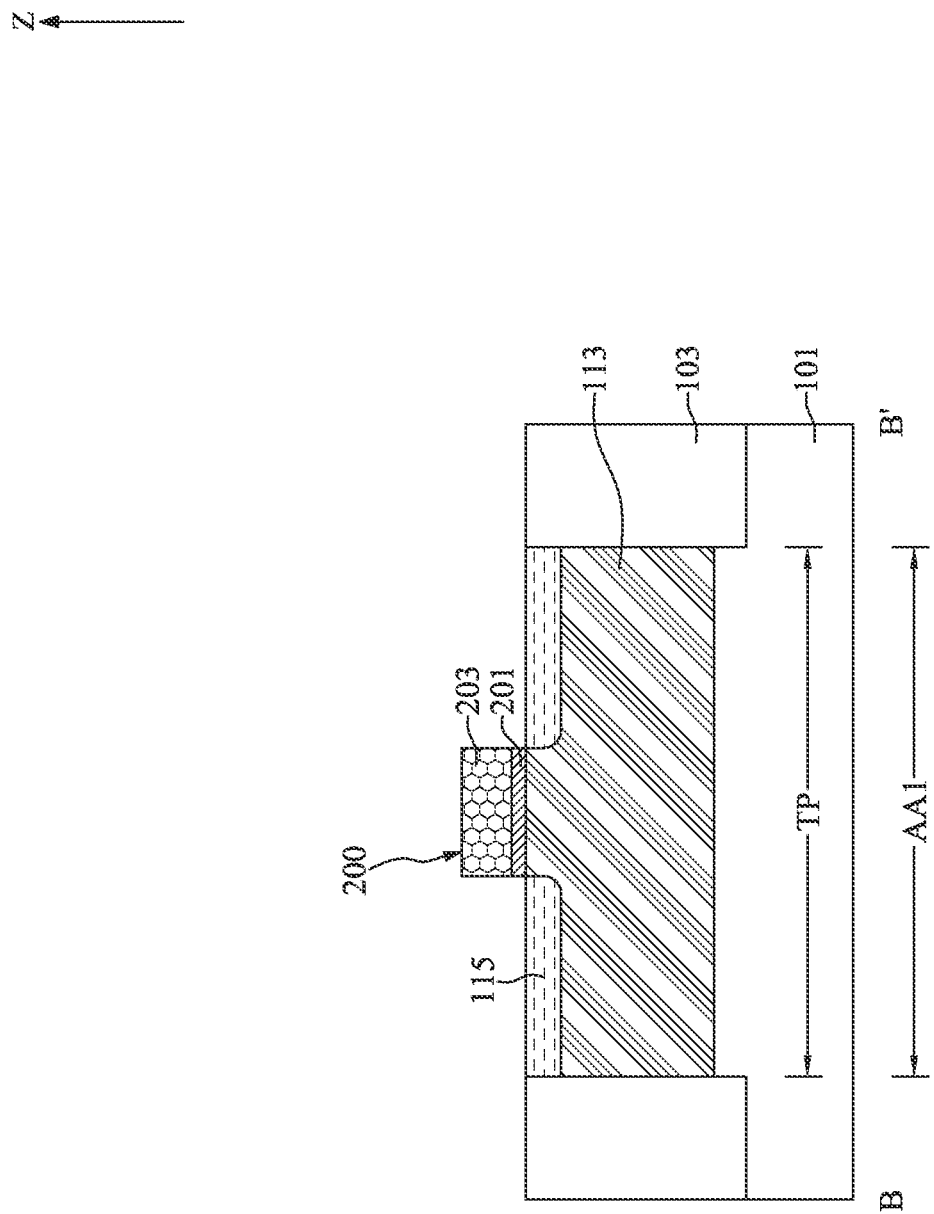

With reference to FIGS. 15 to 17, a n-type impurity implant process may be performed using the gate structures 200 as the masks to form a plurality of light doping regions 115 in the upper parts and lower parts of the transistor portions TP of the active areas AA1, AA2, AA3, AA4, AA5. The n-type impurity implant process may add impurities that contribute free electrons to an intrinsic semiconductor. In a silicon-containing substrate, examples of n-type dopants, i.e., impurities, include but are not limited to antimony, arsenic, or phosphorous. In some embodiments, the light doping regions 115 may have the second electrical type (i.e., the n-type) opposite to the first electrical type.

Figure 18:
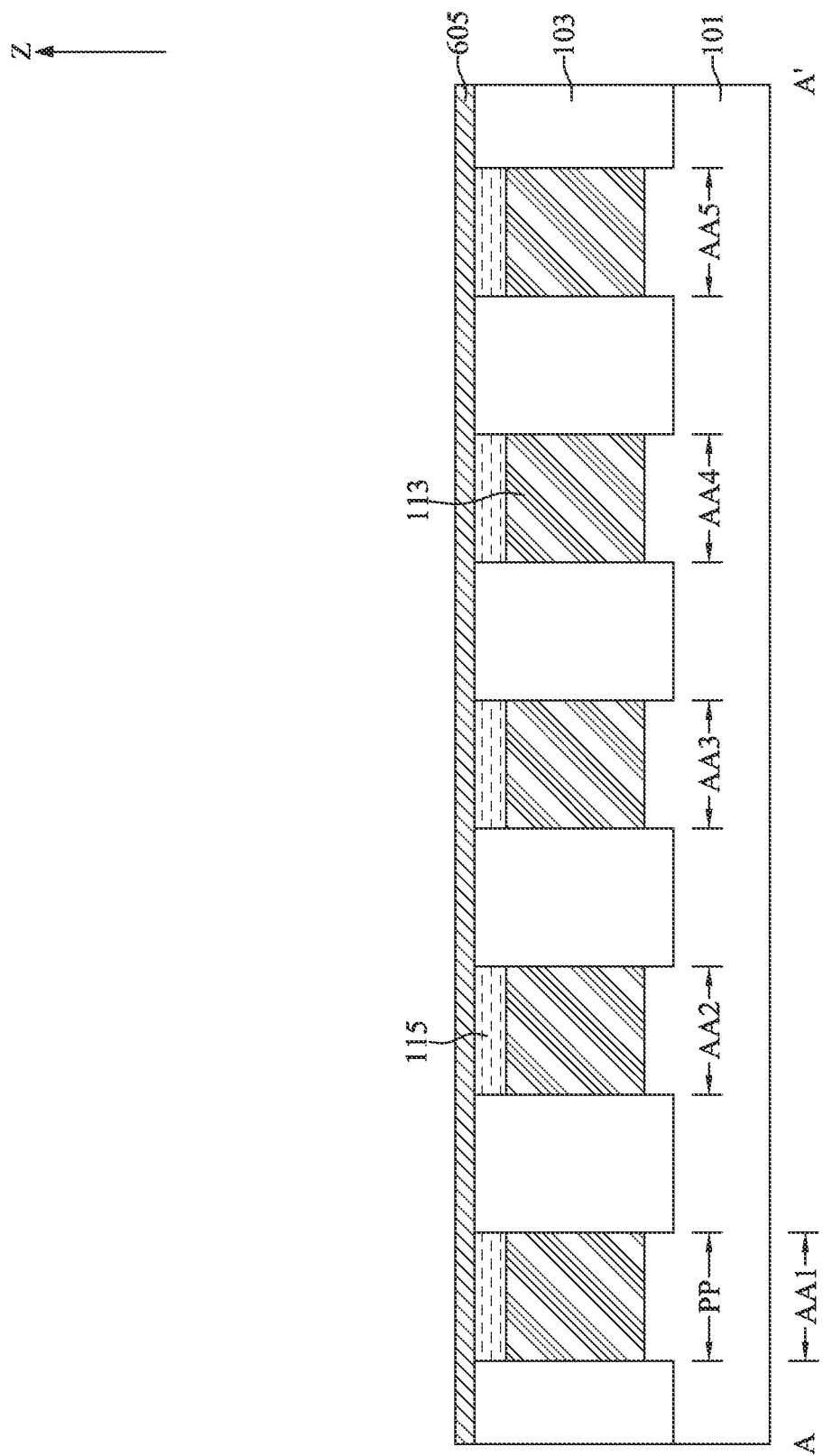
Figure 19:
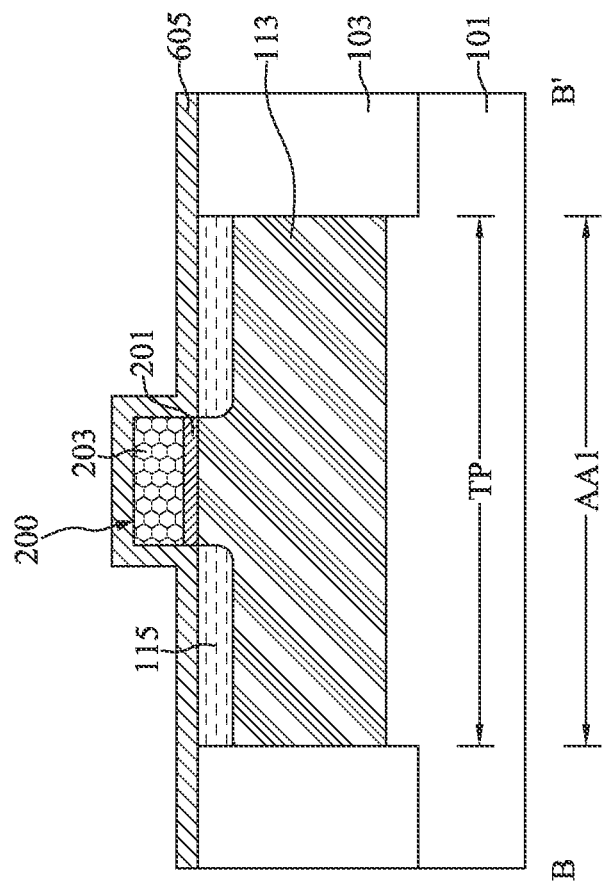

With reference to FIGS. 18 and 19, a layer of spacer material 605 may be conformally formed to cover the intermediate semiconductor device illustrated in FIGS. 15 to 17. In some embodiments, the spacer material 605 may be, for example, silicon oxide, silicon nitride, silicon, oxynitride, nitride oxide, or other suitable insulating material.

In some embodiments, the spacer material 605 may include an energy-removable material. The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source. The base material may include a methylsilsesquioxane based material. The decomposable porogen material may include a porogen organic compound that provides porosity to the base material of the energy-removable material.

Figure 20:
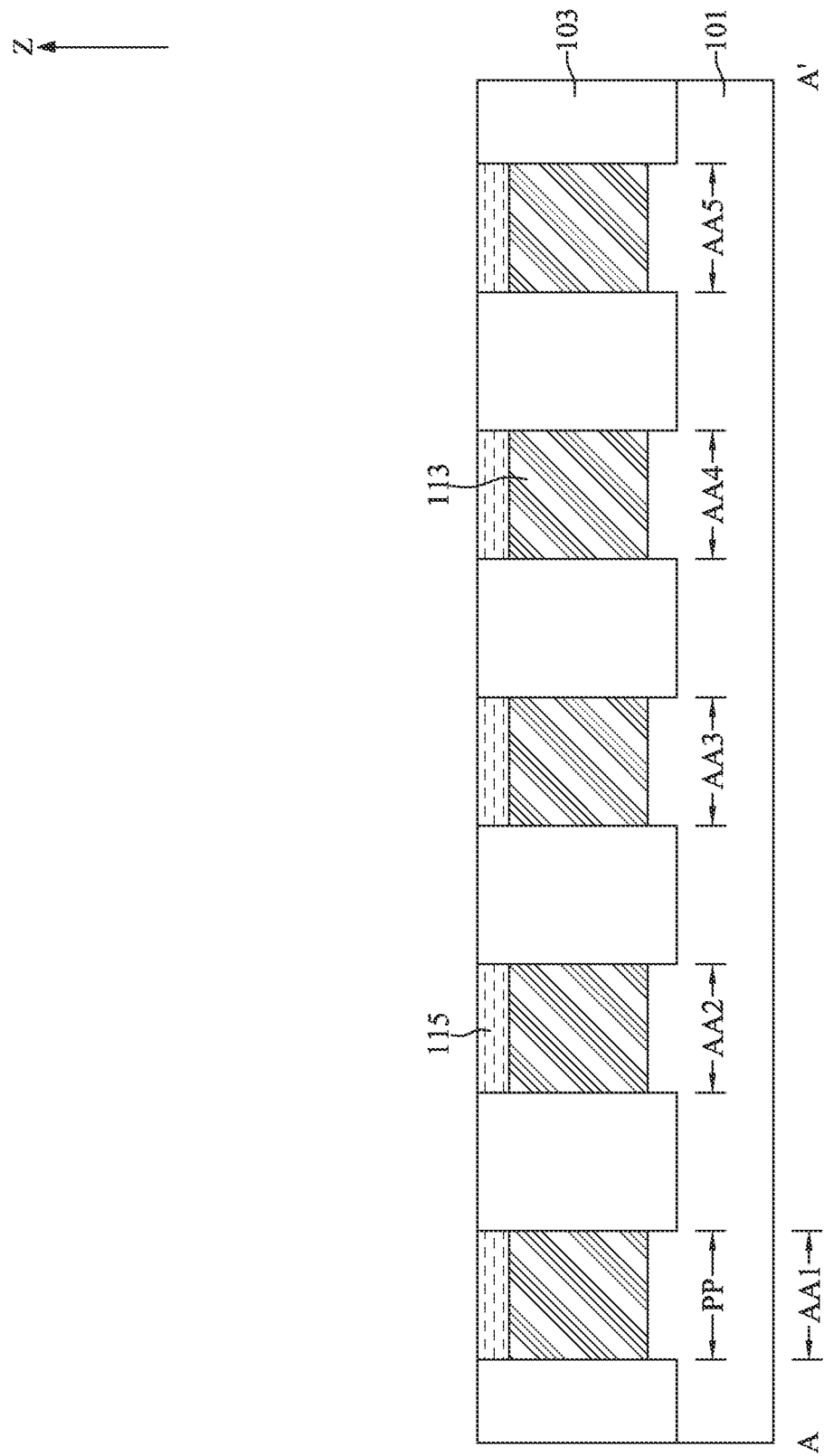
Figure 21:
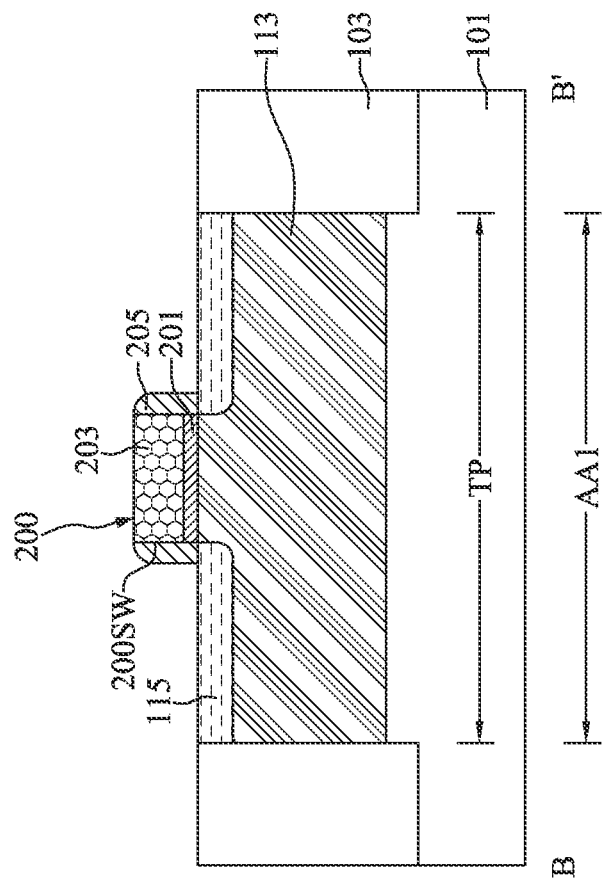

With reference to FIGS. 20 and 21, an etch process, such as an anisotropic dry etch process, may be performed to remove portions of the spacer material 605 and concurrently form gate spacers 205 on the sidewalls 200SW of the gate structures 200. The gate spacers 205 may also cover portions of the light doping regions 115 in the upper parts and the lower parts of the transistor portions TP of the active areas AA1, AA2, AA3, AA4, AA5.

In some embodiments, when the spacer material 605 includes of the energy-removable material, an energy treatment may be performed after the etch process by applying an energy source. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable material to generate empty spaces pores), with the base material remaining in place. The empty spaces (pores) may reduce the dielectric constant of the two gate spacers 205. As a result, the effect of the parasitic capacitance of the gate structures 200 to adjacent elements may be reduced.

With reference to FIGS. 22 to 24, a n-type impurity implant process may be performed using the gate structures 200 and the gate spacers 205 as the masks to form a plurality of source regions 117 in the lower parts of the transistor portions TP of the active areas AA1, AA2, AA3, AA4, AA5 and a plurality of drain regions 119 in the upper parts of the transistor portions TP of the active areas AA1, AA2, AA3, AA4, AA5 and the programmable portions PP of the active areas AA1, AA2, AA3, AA4, AA5. The n-type impurity implant process may be similar to that illustrated in FIGS. 15 to 17, and descriptions thereof are not repeated herein.

For brevity, clarity, and convenience of description, only one source region 117 and one drain region 119 are described.

In some embodiments, the source region 117 and the drain region 119 may have the second electrical type (i.e., the n-type) opposite to the first electrical type. The dopant concentration of the source region 117 and the drain region 119 may be greater than the dopant concentration of the light doping regions 115. In some embodiments, the dopant concentration of the source region 117 and the drain region 119 may be about 1E19 atoms/cm^3 to about 1E21/cm^3. In some embodiments, the length L4 of the source region 117 may be less than the length L5 of the drain region 119 in a top-view perspective. In some embodiments, the length L3 of the gate structure 200 may be greater than the length L4 of the source region 117 in a top-view perspective.

Figure 25:
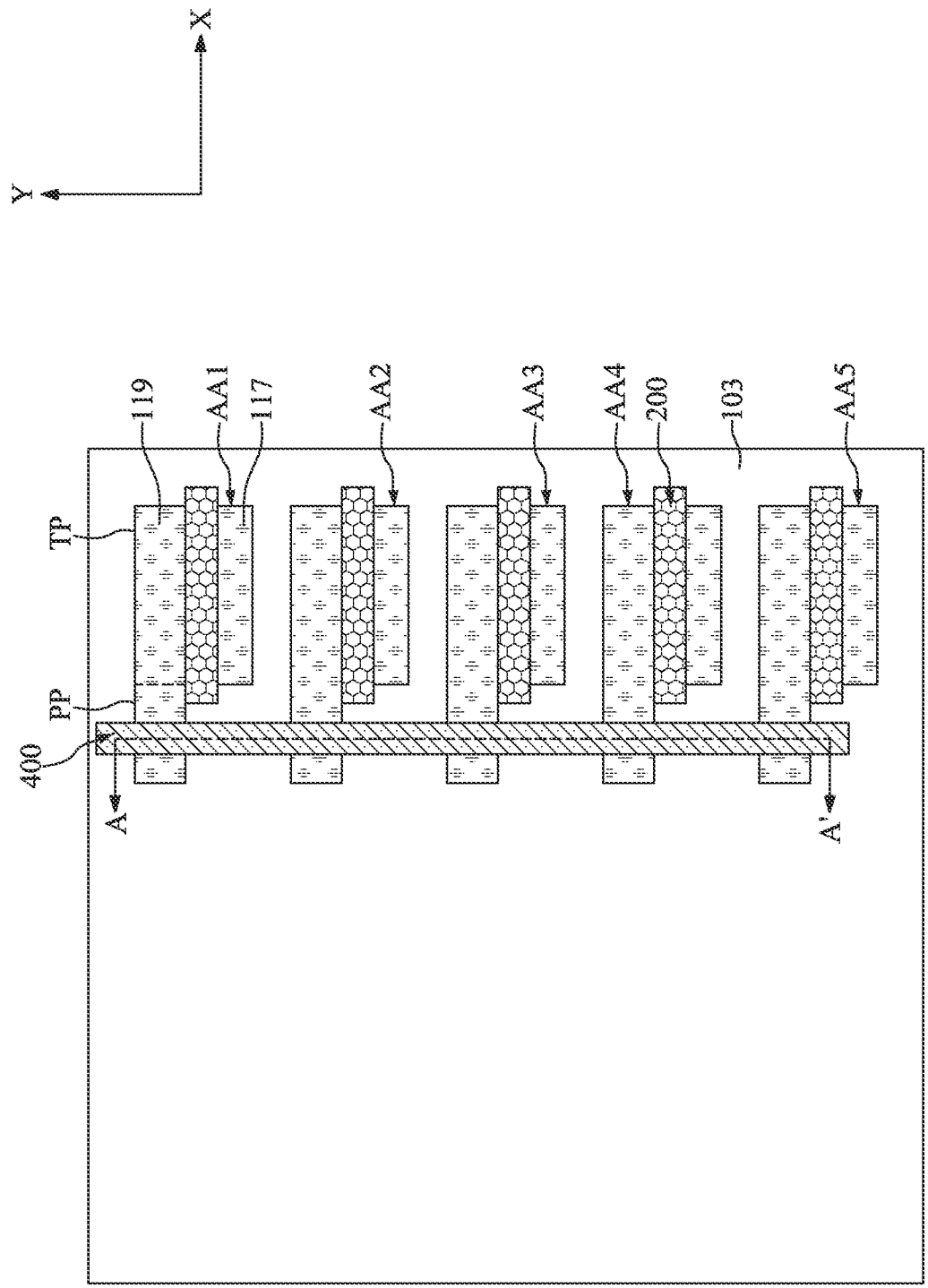
FIG. 25 illustrates, in a schematic top-view diagram, an intermediate semiconductor device in accordance with one embodiment of the present disclosure.
Figure 26:
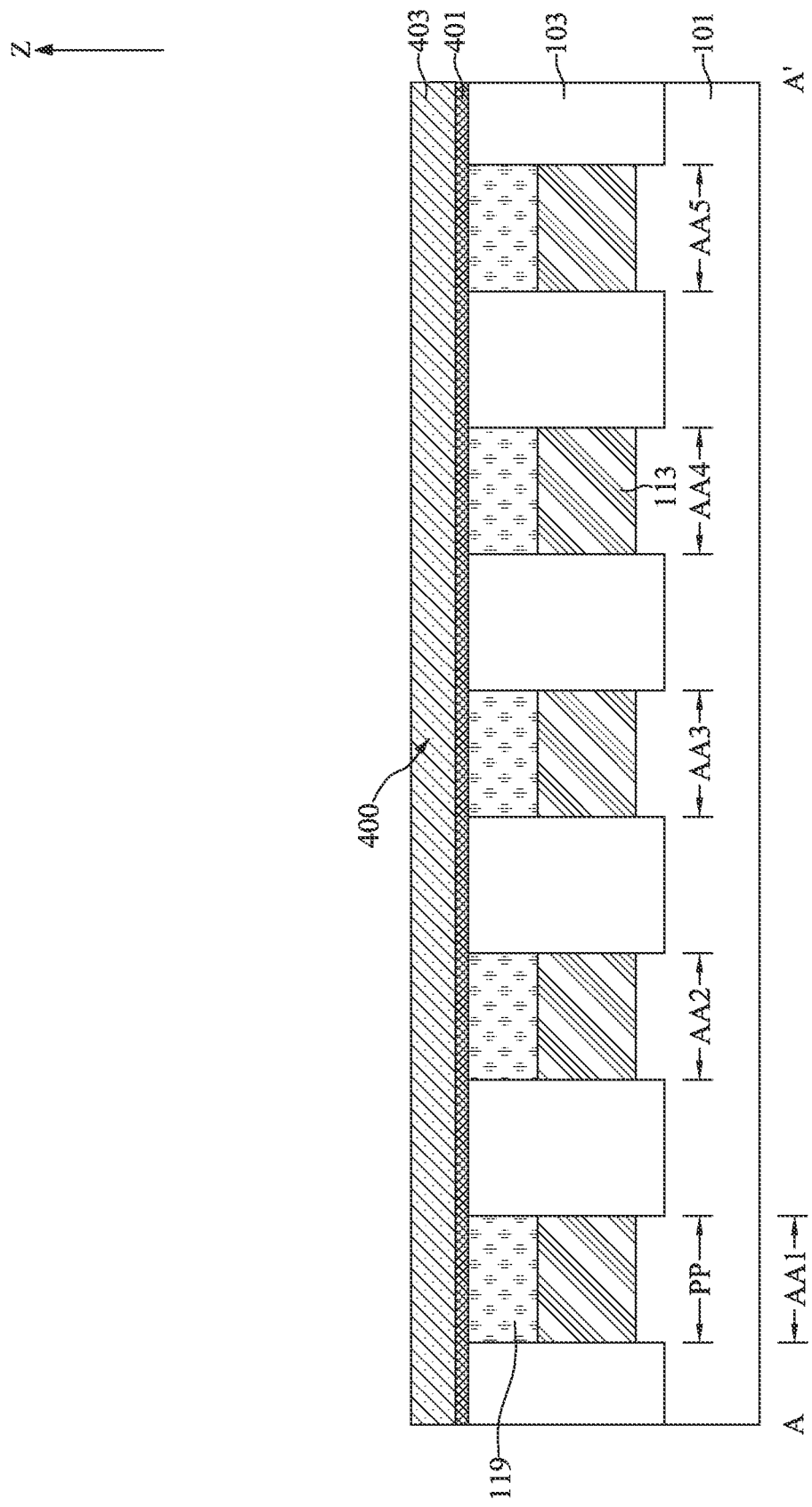
FIG. 26 is a schematic cross-sectional view diagram taken along the line A-A' in FIG. 25 illustrating part of the flow for fabricating the semiconductor device in accordance with one embodiment of the present disclosure.
Figure 27:
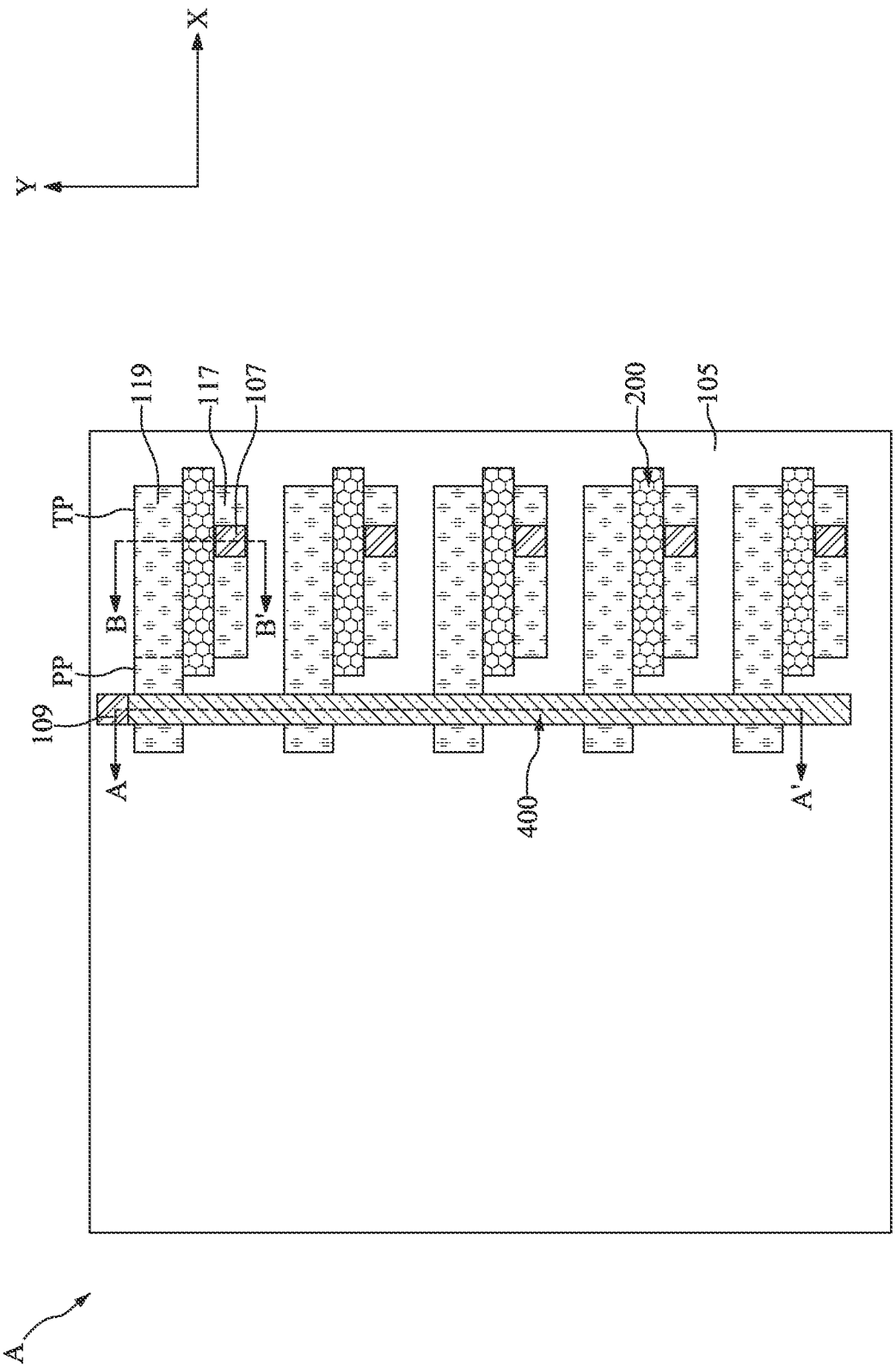
FIG. 27 illustrates, in a schematic top-view diagram, an intermediate semiconductor device in accordance with one embodiment of the present disclosure.
Figure 28:
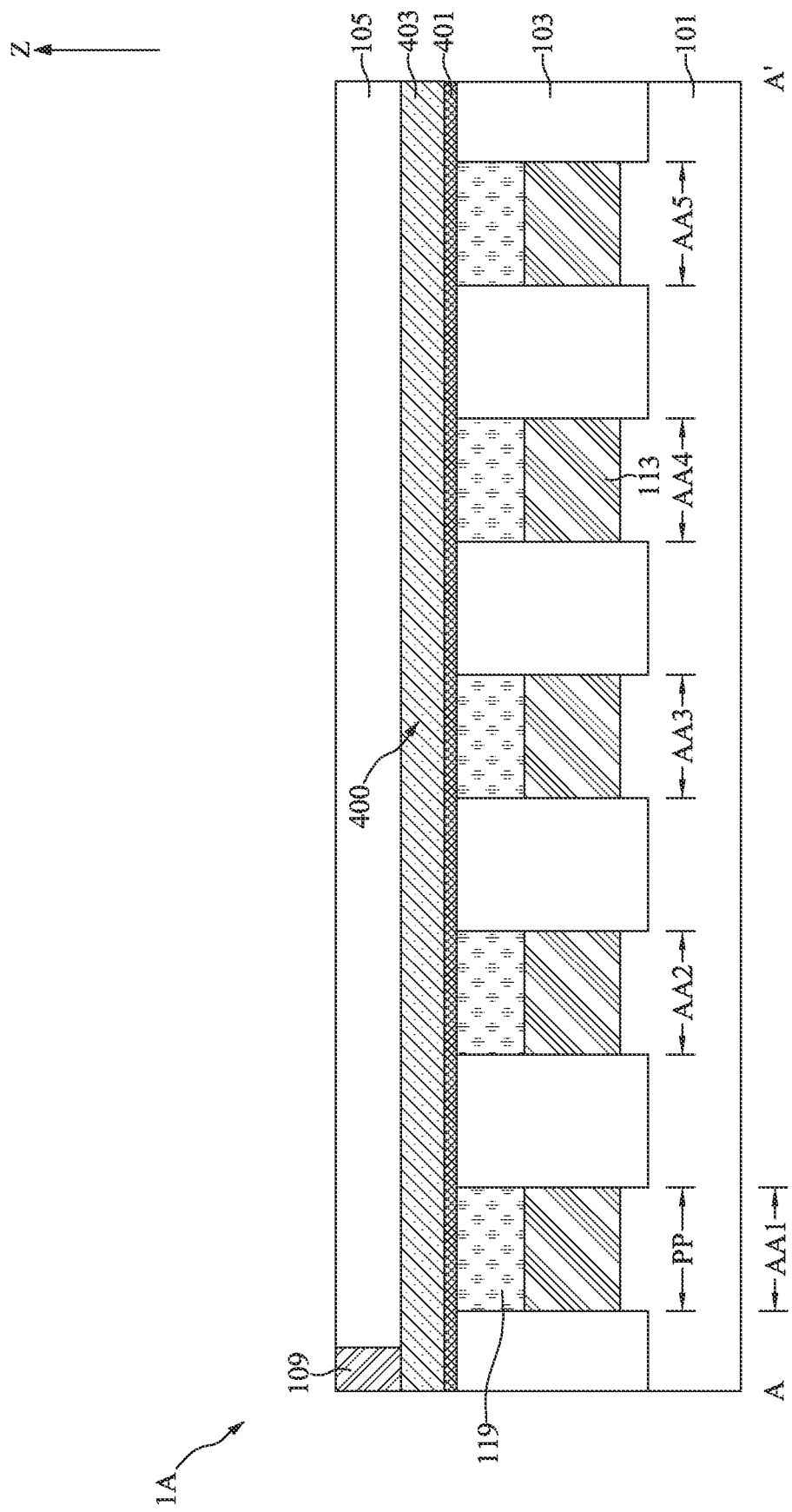
FIGS. 28 and 29 are schematic cross-sectional view diagrams taken along the line A-A' and the line B-B' in FIG. 27 illustrating part of the flow for fabricating the semiconductor device in accordance with one embodiment of the present disclosure.
Figure 29:
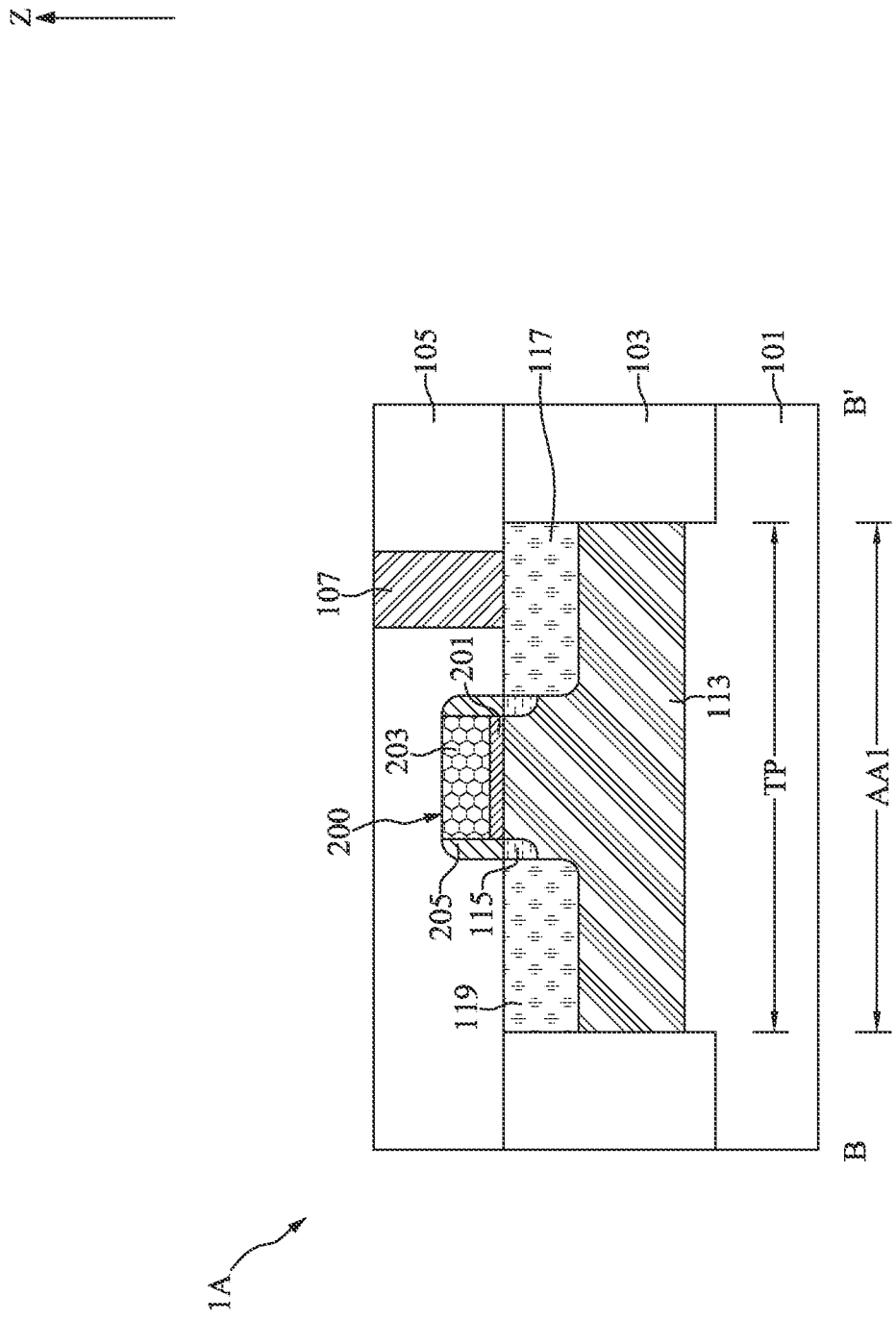

FIG. 25 illustrates, in a schematic top-view diagram, an intermediate semiconductor device in accordance with one embodiment of the present disclosure, FIG. 26 is a schematic cross-sectional view diagram taken along the line A-A' in FIG. 25 illustrating part of the flow for fabricating the semiconductor device 1A in accordance with one embodiment of the present disclosure. FIG. 27 illustrates, in a schematic top-view diagram, an intermediate semiconductor device in accordance with one embodiment of the present disclosure. FIGS. 28 and 29 are schematic cross-sectional view diagrams taken along the line A-A' and the line B-B' in FIG. 27 illustrating part of the flow for fabricating the semiconductor device 1A in accordance with one embodiment of the present disclosure. With reference to FIGS. 1, 25, and 26, at step S15, a middle insulating layer 401 may be formed on the plurality of drain regions 119, and an upper conductive layer 403 may be formed on the middle insulating layer 401, wherein the plurality of drain regions 119, the middle insulating layer 401, and the upper conductive layer 403 together configure a plurality of programmable structures 400.

With reference to FIGS. 1, 25, and 26, the middle insulating layer 401 may extend along the direction Y and may be formed on the drain regions 119. The middle insulating layer 401 may orthogonally intersect with the drain regions 119. It should be noted that the middle insulating layer 401 is not overlapped with the gate structures 200 in a top-view perspective.

In some embodiments, the middle insulating layer 401 may be formed of, for example, silicon oxide. In some embodiments, the middle insulating layer 401 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof.

Illustrative examples of high-k dielectric material may include, but are not limited to, hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yrttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof.

In some embodiments, the middle insulating layer 401 may be a multilayer structure that includes, for example, one layer of silicon oxide and another layer of high-k dielectric material.

With reference to FIGS. 25 and 26, the upper conductive layer 403 may be formed on the middle insulating layer 401. In some embodiments, the upper conductive layer 403 may be formed of for example, (doped) polycrystalline silicon, (doped) polycrystalline germanium, (doped) polycrystalline silicon germanium, or other suitable conductive material.

In some embodiments, the middle insulating layer 401 and the upper conductive layer 403 may be formed while masking the gate structures 200. In some embodiments, the middle insulating layer 401 and the upper conductive layer 403 may be formed concurrently with the gate structures 200.

With reference to FIGS. 25 and 26, the middle insulating layer 401, the upper conductive layer 403, and a corresponding drain region 119 together configure the programmable structure 400. The programmable structure 400 may be, for example, an anti-fuse. An anti-fuse is non-conductive in the native unprogrammed state and becomes conductive when programmed. For example, the anti-fuse may be constructed with a thin dielectric layer sandwiched between two conductors. In the present embodiment, the drain region 119 may serve as the lower conductor of the programmable structure 400. The upper conductive layer 403 may serve as the upper conductor of the programmable structure 400. The middle insulating layer 401 may serve as the dielectric layer sandwiched between the lower and the upper conductors.

With reference to FIG. 1 and FIGS. 27 to 29, at step S17, a plurality of first contacts 107 may be formed to electrically connect to the plurality of source regions 117, and a second contact 109 may be formed to electrically connect to the upper conductive layer 403.

With reference to FIGS. 27 to 29, an inter-dielectric layer 105 may be formed to cover the substrate 101, the gate structures 200, and the programmable structures 400. The inter-dielectric layer 105 may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. The term "low-k" as used throughout the present disclosure denotes a dielectric material that has a dielectric constant of less than silicon dioxide. In some embodiments, the inter-dielectric layer 105 may include a self-planarizing material such as a spin-on glass or a spin-on low-k dielectric material such as SiLK™. The use of a self-planarizing dielectric material may avoid the need to perform a subsequent planarizing step. In some embodiments, the inter-dielectric layer 105 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIGS. 27 to 29, the plurality of first contacts 107 and the second contact 109 may be formed in the inter-dielectric layer 105. For brevity, clarity, and convenience of description, only one first contact 107 is described. The first contact 107 may be formed on the source region 117 and electrically connected to the source region 117. The second contact 109 may be formed on the upper conductive layer 403 and electrically connected to the upper conductive layer 403. The first contact 107 and the second contact 109 may be formed by, for example, a damascene process.

Generally, in the damascene process, one or more dielectric materials (i.e., the inter-dielectric layer 105) may be deposited and pattern etched to form the vertical interconnects, also known as vias or contacts. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material-external to the etched pattern, such as on the field of the substrate, may be then removed by a planarization process such as chemical mechanical polishing.

In some embodiments, the first contact 107 and the second contact 109 may be formed of, for example, polycrystalline silicon, polycrystalline germanium, polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof.

When programming the programmable structure 400, a high voltage (e.g., +6.0 volts) may be applied to the upper conductive layer 403 through the second contact 109, a selection voltage (e.g., +1.5 volts) may be applied to the gate structure 200, and the first contact 107 may be grounded, the middle insulating layer 401 sandwiched by the upper conductive layer 403 and the drain region 119 may be stressed under the programming voltage. As a result, the sandwiched portion of the middle insulating layer 401 will be ruptured to form a contiguous path connecting the upper conductive layer 403 and the drain region 119. In other words, the sandwiched portion of the middle insulating layer 401 may be blown out and the programmable structure 400 is programmed.

It should be noted that all the drains 119 can be respectively incorporated with the middle insulating layer 401 and the upper conductive layer 403 to configure multiple programmable structures 400. The multiple programmable structures 400 may configure a programmable array with a common upper conductor (i.e., the upper conductive layer 403). The selection of programmable structure 400 to be programmed may be achieved by controlling the gate structure 200 associated with the corresponding drain region 119.

Conventionally, a programmable structure may electrically couple to other conductive features through, for example, M0 routing which requires additional wafer area and more complicate design.

In contrast, the programmable structure 400 integrates the drain region 119 associated with the gate structure 200 as the lower conductor so that the occupied area of the programmable structure 400 may be reduced. Therefore, more area may be available for other sophisticated functional units or more programmable structures 400. As a result, the performance of the semiconductor device 1A may be improved. In addition, the gate structure 200 associated with the programmable structure 400 may also serve as an isolation transistor to isolate the high programming voltage to adjacent elements. Therefore, the damage to the adjacent elements by the high programming voltage (e.g., the leakage current originated from the high programming voltage) may be reduced. The reliability of the semiconductor device 1A may be improved, accordingly.

FIGS. 30 to 33 are schematic cross-sectional view diagrams illustrating part of a flow for fabricating a semiconductor device 1B in accordance with another embodiment of the present disclosure.

Figure 30:
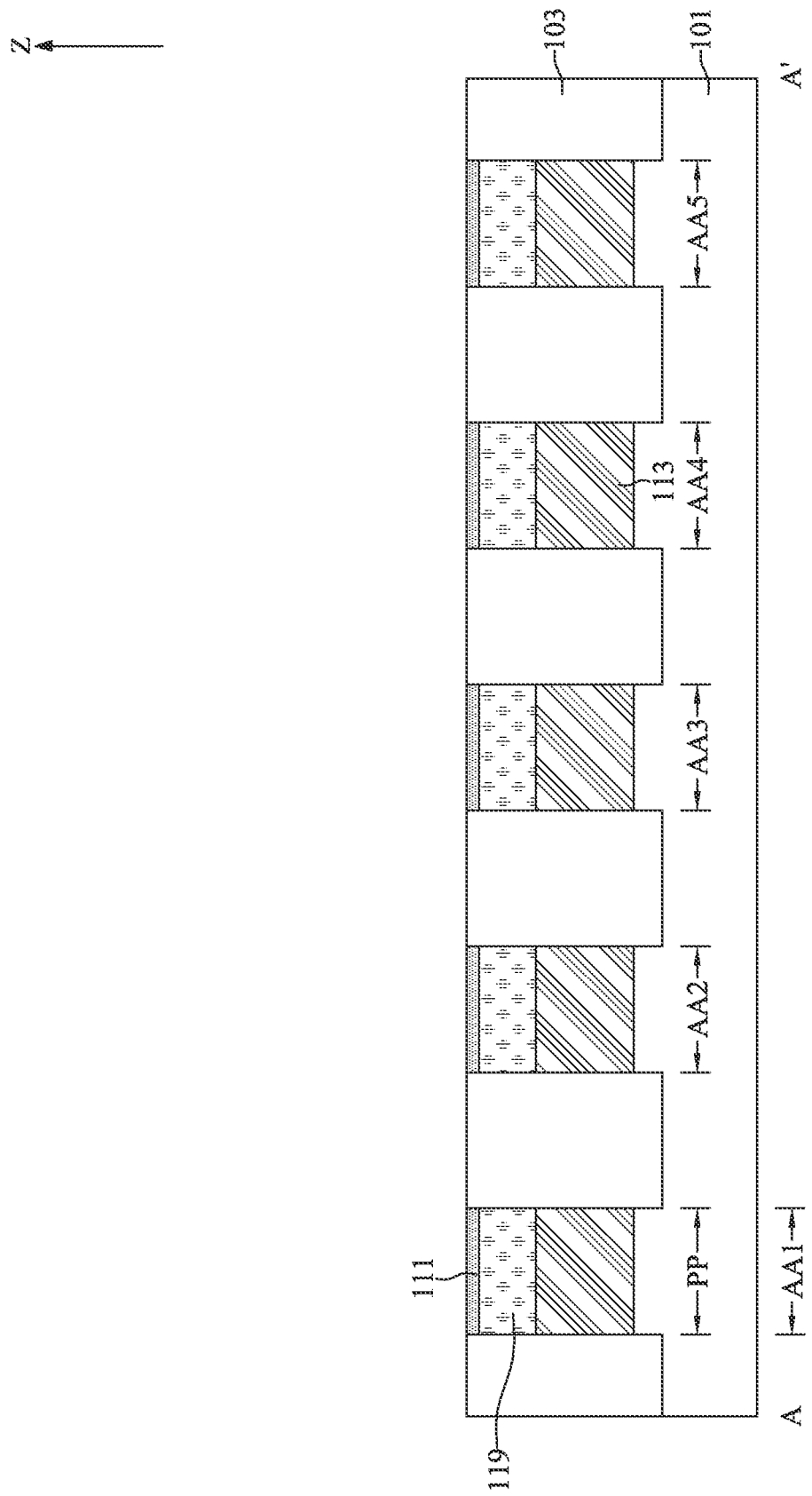
FIGS. 30 to 33 are schematic cross-sectional view diagrams illustrating part of a flow for fabricating a semiconductor device in accordance with another embodiment of the present disclosure.
Figure 31:
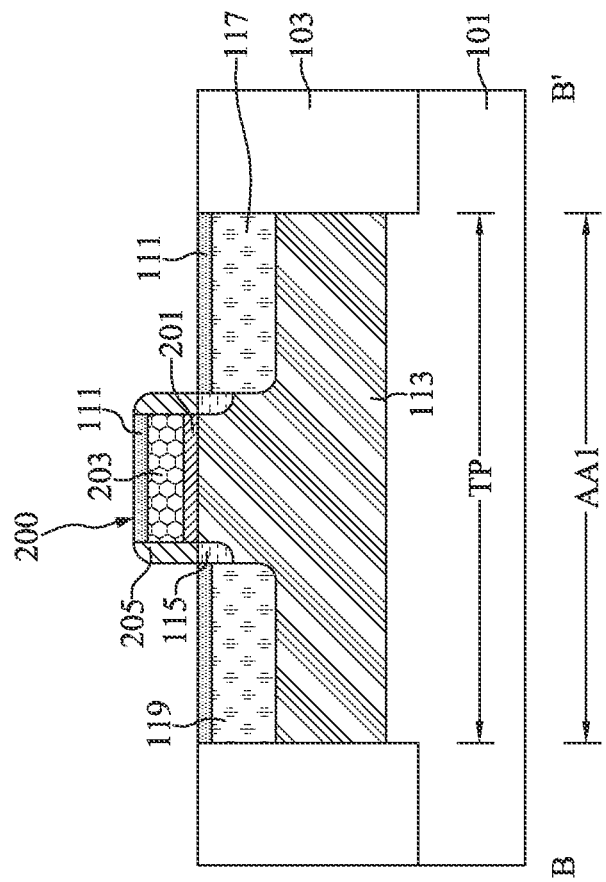

With reference to FIGS. 30 and 31, an intermediate semiconductor device may be fabricated with a procedure similar to that illustrated in FIGS. 2 to 24. A layer of conductive material (not shown) may be conformally formed to cover the intermediate semiconductor device. The conductive material may include, for example, titanium, nickel, platinum, tantalum, or cobalt. Subsequently, a thermal treatment may be performed. During the thermal treatment, metal atoms of the layer of conductive material may react chemically with silicon atoms of the source region 117, the drain region 119, and the gate conductive layer 203 to form the plurality of intervening layers 111. The plurality of intervening layers 111 may include titanium silicide, nickel silicide, nickel platinum suicide, tantalum silicide, or cobalt silicide. The thermal treatment may be a dynamic surface annealing process. After the thermal treatment, a cleaning process may be performed to remove the unreacted conductive material. The cleaning process may use etchant such as hydrogen peroxide and an SC-1 solution.

In some embodiments, the thickness of the plurality of intervening layers 111 may be between about 2 nanometers and about 20 nanometers.

Figure 32:
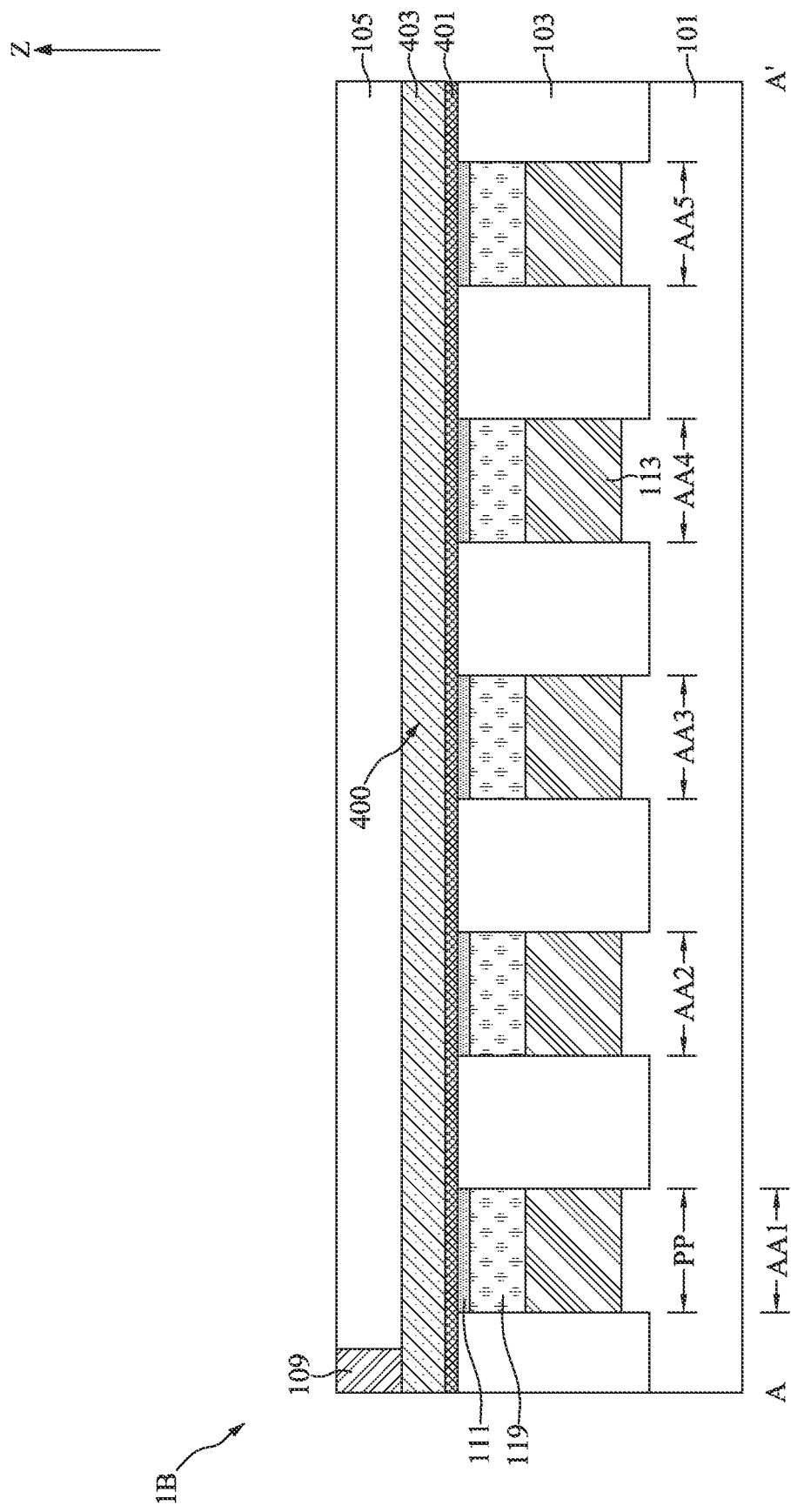
Figure 33:
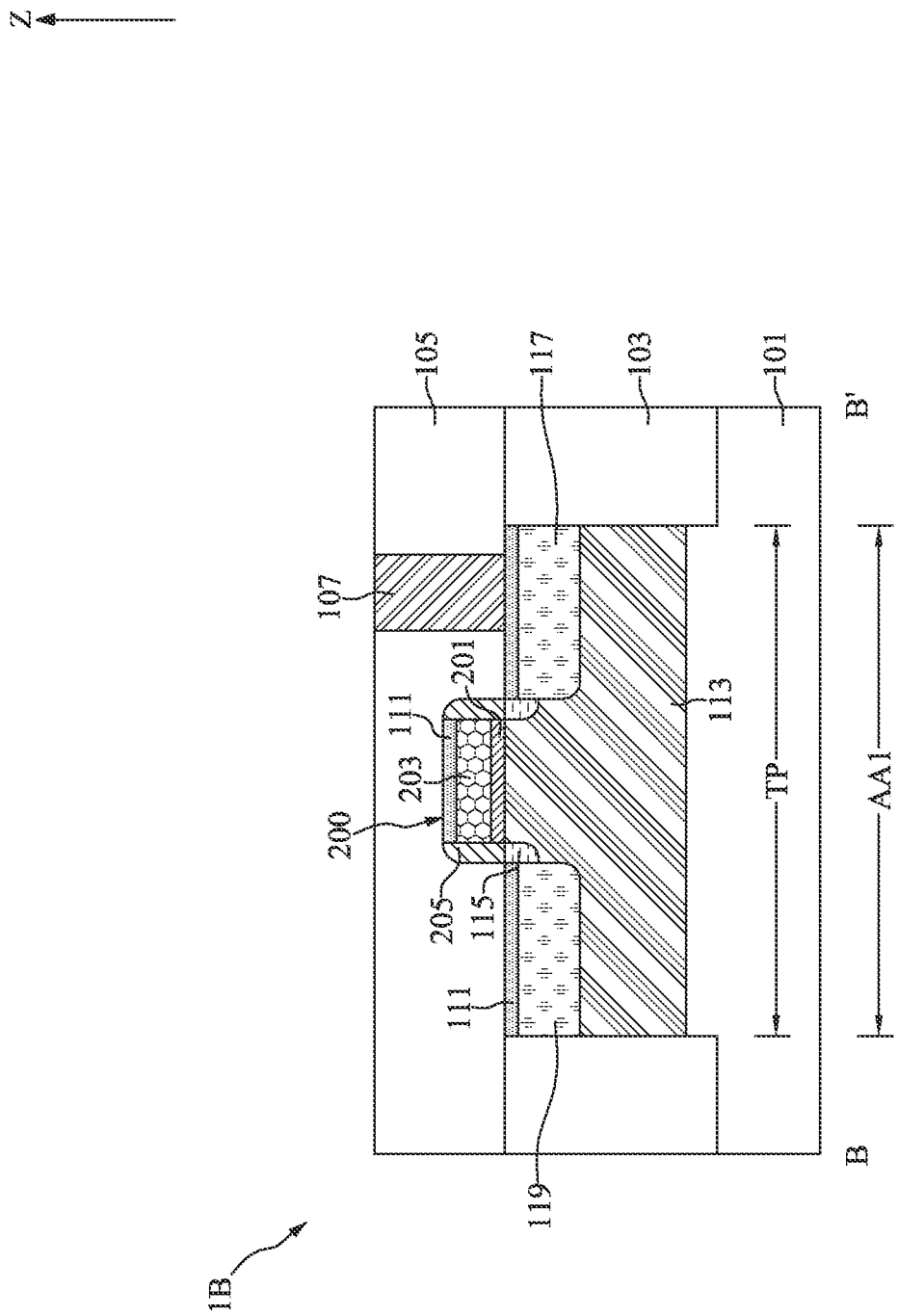

With reference to FIGS. 32 and 33, the middle insulating layer 401, the upper conductive layer 403, the inter-dielectric layer 105, the first contact 107, and the second contact 109 may be formed of a procedure similar to that illustrated in FIGS. 25 to 29, and descriptions thereof are not repeated herein. The plurality of intervening layers 111 may reduce the contact resistance of the source region 117, the drain region 119, and the gate conductive layer 203 so as to reduce the power consumption of the semiconductor device 1B.

Figure 34:
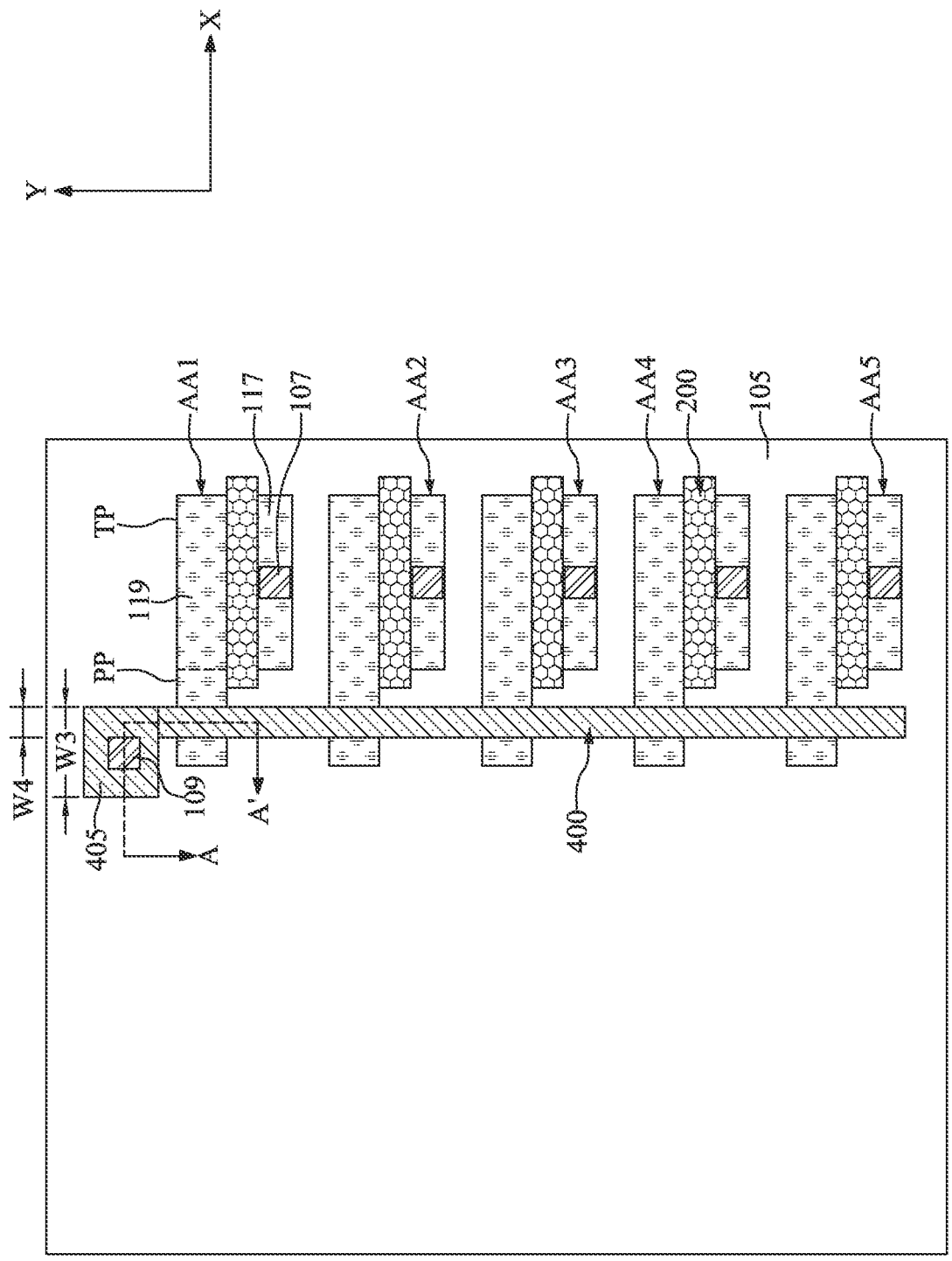
FIG. 34 illustrates, in a schematic top-view diagram, a semiconductor device in accordance with another embodiment of the present disclosure.
Figure 35:
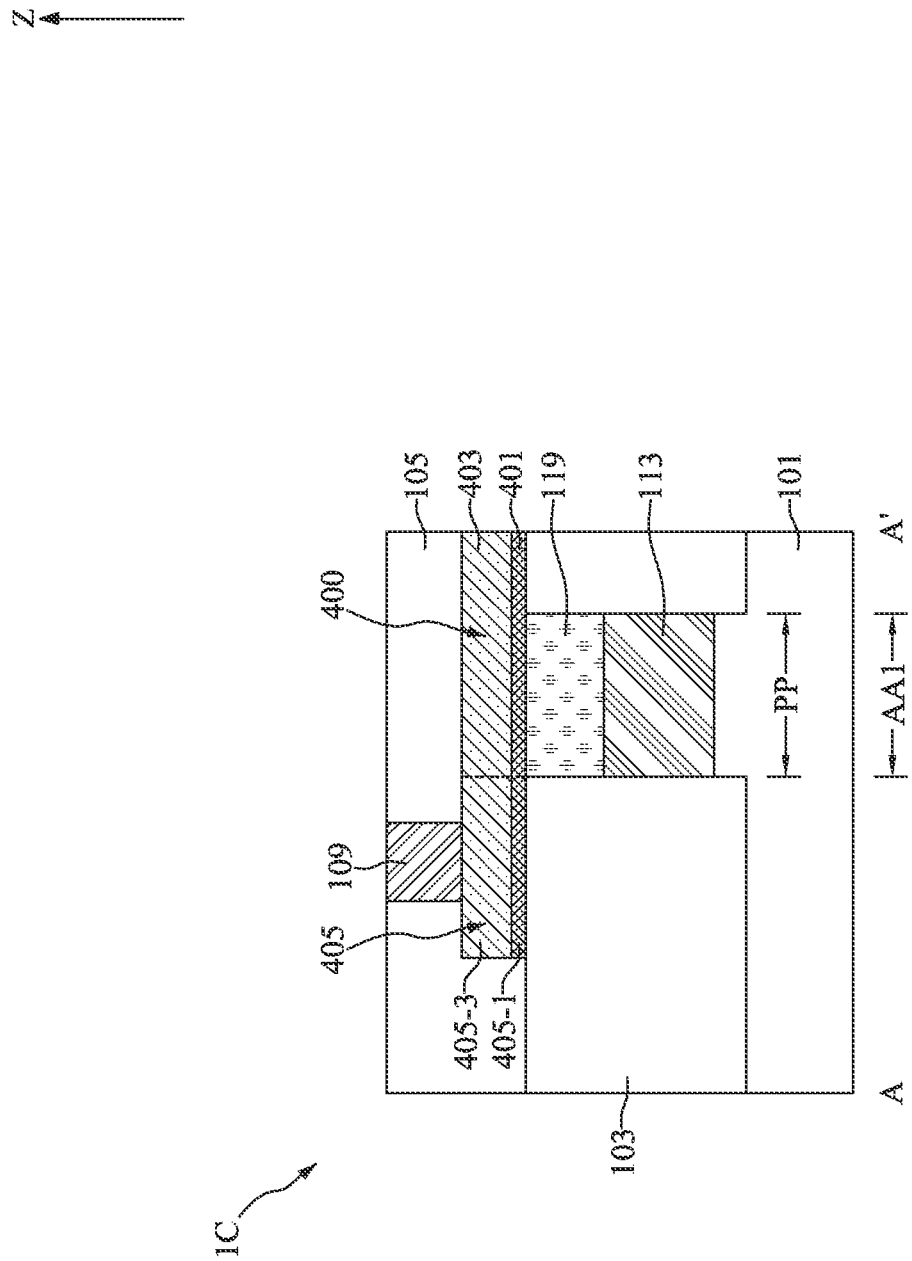
FIG. 35 is a schematic cross-sectional view diagram taken along a line A-A' in FIG. 34.

FIG. 34 illustrates, in a schematic top-view diagram, a semiconductor device IC in accordance with another embodiment of the present disclosure. FIG. 35 is a schematic cross-sectional view diagram taken along a line A-A' in FIG. 34.

With reference to FIGS. 34 and 35, a first connecting pad 405 may be connected to one end of the programmable structure 400 and may be electrically connected to the programmable structure 400. The first connecting pad 405 may include a bottom insulating layer 405-1 and a top conductive layer 405-3. The bottom insulating layer 405-1 may be disposed on the isolation layer 103 and connected to the middle insulating layer 401. The top conductive layer 405-3 may be disposed on the bottom insulating layer 4054 and connected to the upper conductive layer 403. The second contact 109 may be disposed on the top conductive layer 405-3. The programming voltage may be applied to the programmable structure 400 through the second contact 109 and the first connecting pad 405. In some embodiments, the width W3 of the first connecting pad 405 may be greater than the width W4 of the programmable structure 400.

In some embodiments, the first connecting pad 405 may be formed concurrently with the middle insulating layer 401 and the upper conductive layer 403. In some embodiments, the bottom insulating layer 405-1 may be formed of the same material as the middle insulating layer 401. In some embodiments, the top conductive layer 405-3 may be formed of the same material as the upper conductive layer 403.

Figure 36:
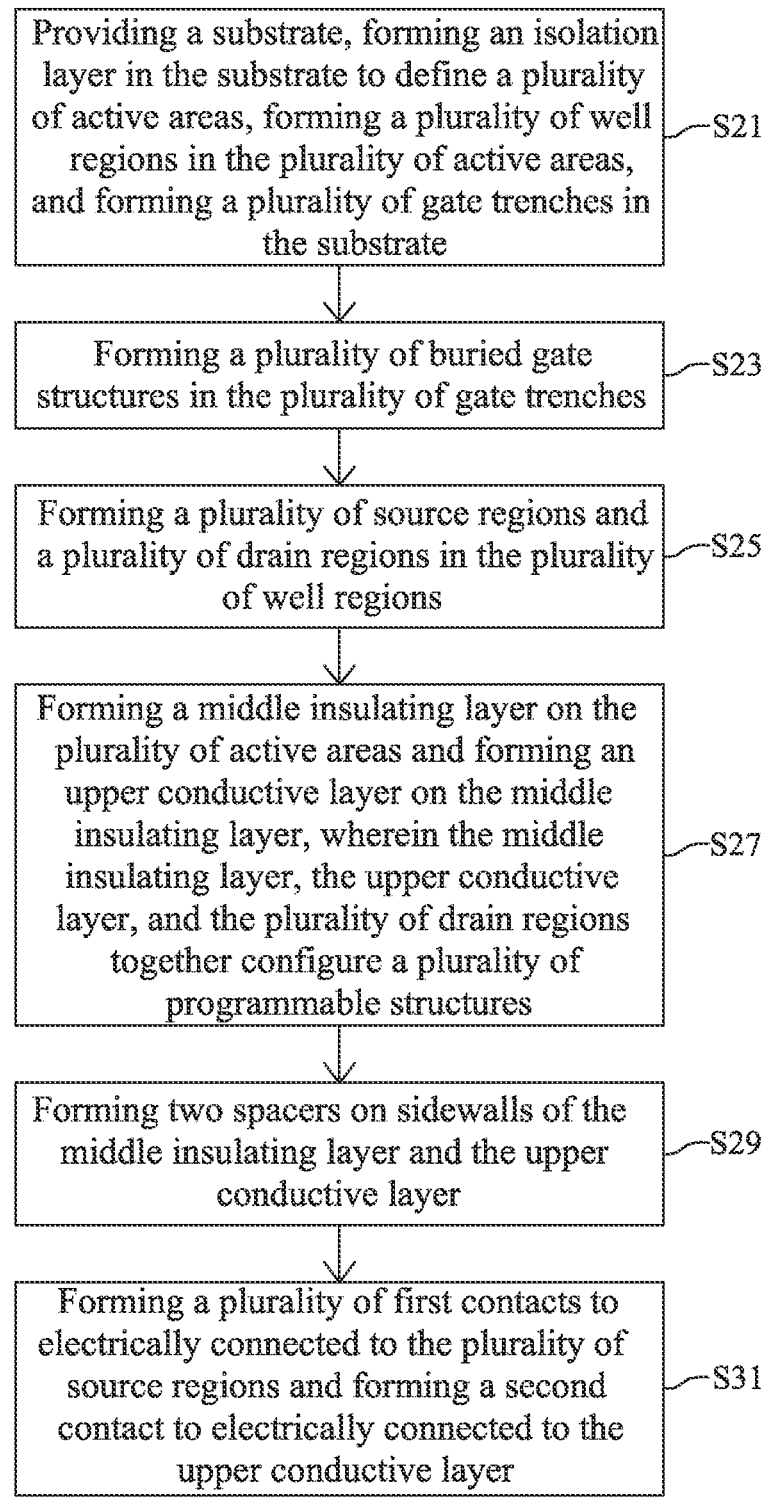
FIG. 36 illustrates, in a flowchart diagram form, a method for fabricating a semiconductor device in accordance with another embodiment of the present disclosure.
Figure 37:
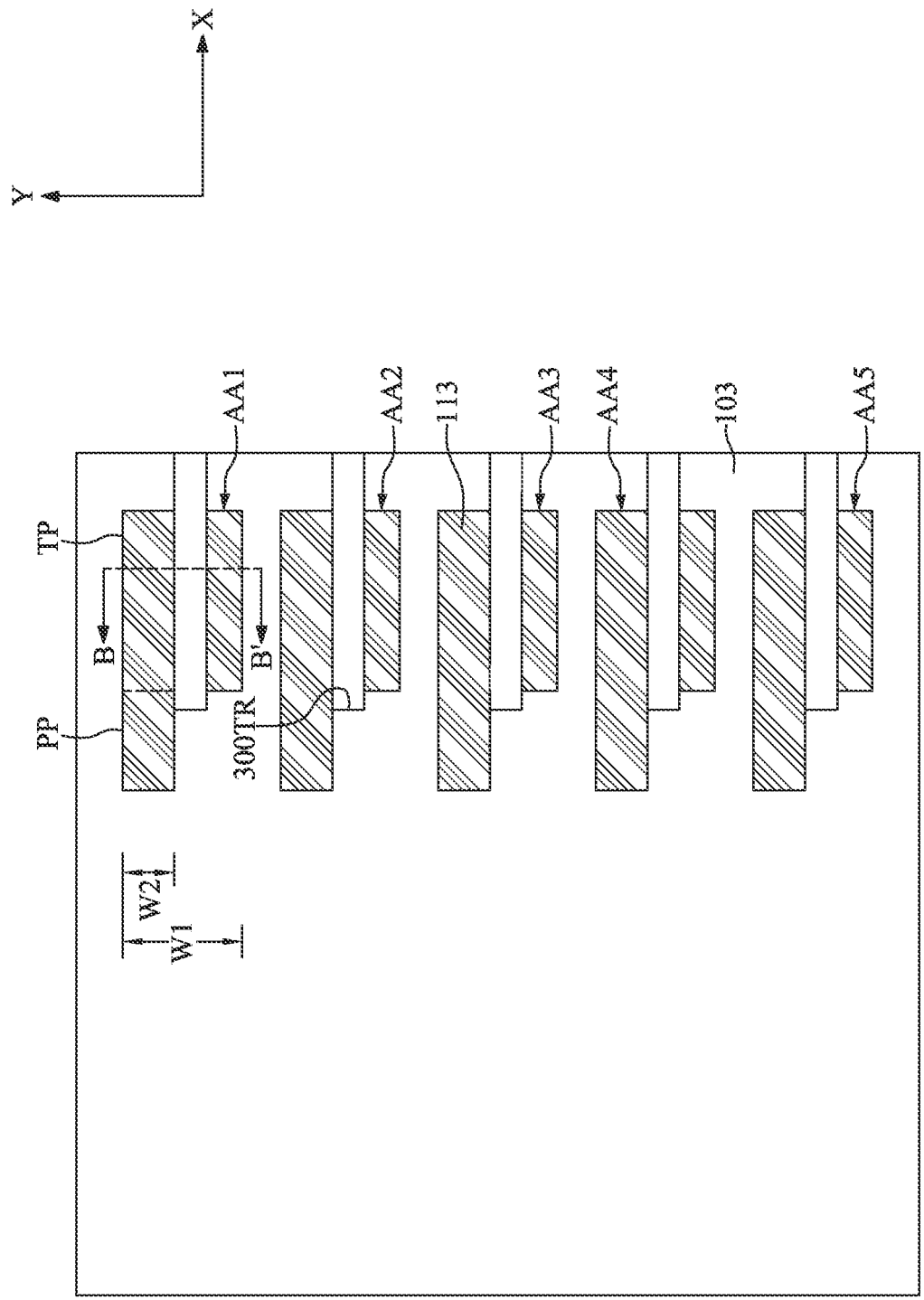
FIG. 37 illustrates, in a schematic top-view diagram, an intermediate semiconductor device in accordance with another embodiment of the present disclosure.

FIG. 36 illustrates, in a flowchart diagram form, a method 20 for fabricating a semiconductor device 1D in accordance with another embodiment of the present disclosure. FIG. 37 illustrates, in a schematic top-view diagram, an intermediate semiconductor device in accordance with another embodiment of the present disclosure, FIG. 38 is a schematic cross-sectional view diagram taken along the line the line B-B' in FIG. 37 illustrating part of a flow for fabricating the semiconductor device 1D in accordance with another embodiment of the present disclosure.

Figure 38:
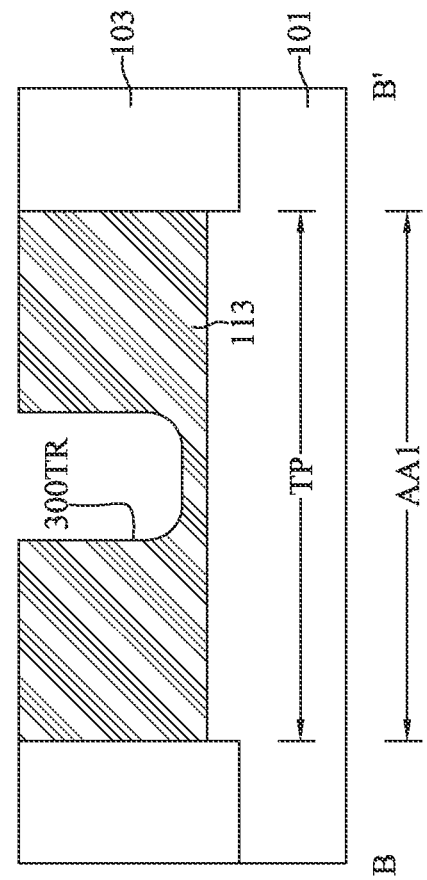
FIG. 38 is a schematic cross-sectional view diagram taken along the line the line B-B' in FIG. 37 illustrating part of a flow for fabricating the semiconductor device in accordance with another embodiment of the present disclosure.

With reference to FIGS. 36 to 38, at step S21, a substrate 101 may be provided, an isolation layer 103 may be formed in the substrate 101 to define a plurality of active areas AA1, AA2, AA3, AA4, AA5, a plurality of well regions 113 may be formed in the plurality of active areas AA1, AA2, AA3, AA4, AA5, and a plurality of gate trenches 300TR may be formed in the substrate 101.

With reference to FIGS. 37 and 38, the substrate 101, the isolation layer 103, the active areas AA1, AA2, AA3, AA4, AA5, and the well regions 113 may be formed with a procedure similar to that illustrated in FIGS. 2 to 11, and descriptions thereof are not repeated herein. For brevity, clarity, and convenience of description, only one gate trench 300TR is described. In a top view perspective, the gate trench 300TR may extend along the direction X and may divide the transistor portion TP of the active area AA1 into an upper part and a lower part.

Figure 39:
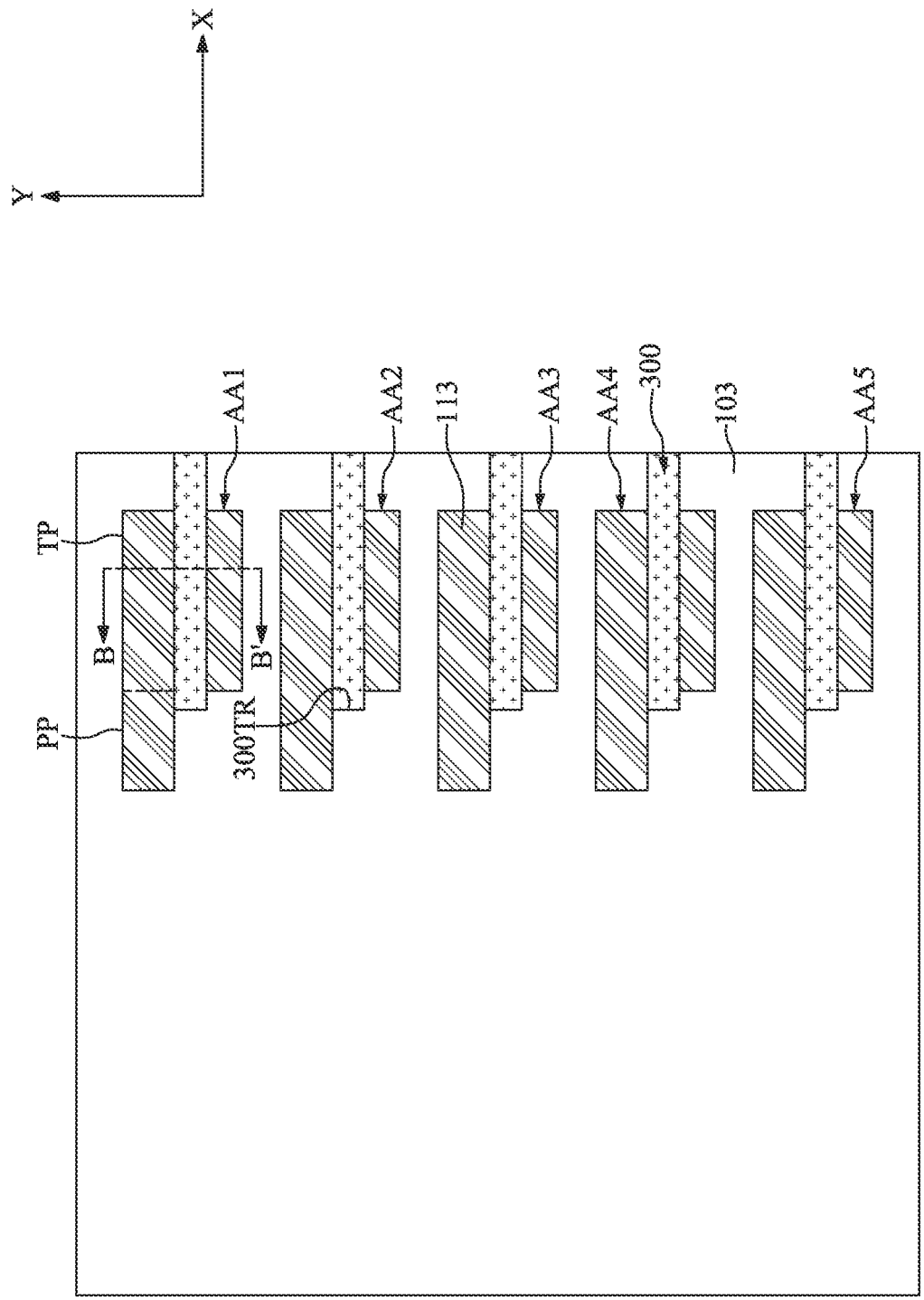
FIG. 39 illustrates, in a schematic top-view diagram, an intermediate semiconductor device in accordance with another embodiment of the present disclosure.
Figure 40:
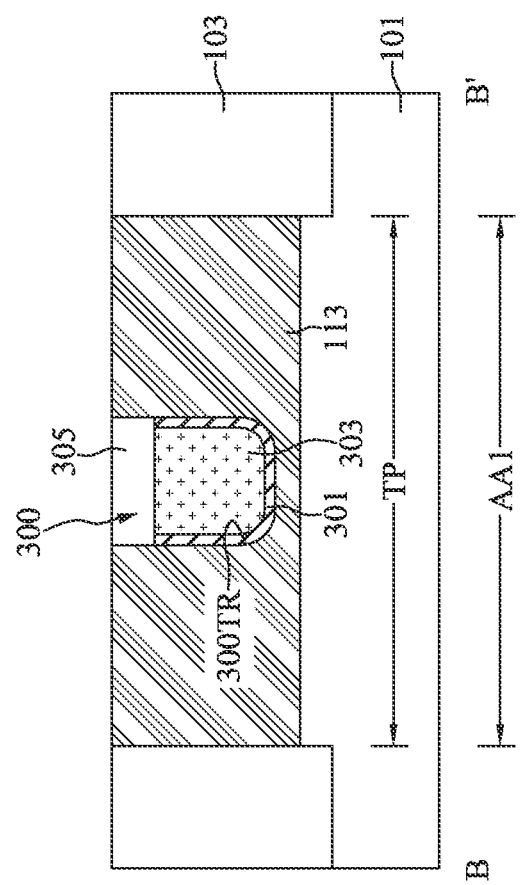
FIG. 40 is a schematic cross-sectional view diagram taken along the line B-B' in FIG. 39 illustrating part of the flow for fabricating the semiconductor device in accordance with another embodiment of the present disclosure.

FIG. 39 illustrates, in a schematic top-view diagram, an intermediate semiconductor device in accordance with another embodiment of the present disclosure. FIG. 40 is a schematic cross-sectional view diagram taken along the line B-B' in FIG. 39 illustrating part of the flow for fabricating the semiconductor device 1D in accordance with another embodiment of the present disclosure.

With reference to FIGS. 36, 39, and 40, at step 523, a plurality of buried gate structures 300 may be formed in the plurality of gate trenches 300TR.

For brevity, clarity, and convenience of description, only one buried gate structure 300 is described.

With reference to FIGS. 39 and 40, the buried gate structure 300 may include a buried gate insulating layer 301, a buried gate conductive layer 303, and a buried gate capping layer 305. The buried gate insulating layer 301 may be conformally formed in the gate trench 300TR and may have a U-shaped cross-sectional profile. In some embodiments, the buried gate insulating layer 301 may include, for example, one or more of a silicon oxide layer, a silicon nitride layer, a silicon oxynitride layer, and a high-k dielectric material. For example, the high-k dielectric material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof.

The buried gate conductive layer 303 may be formed on the buried gate insulating layer 301. In some embodiments, the buried gate conductive layer 303 may include, for example, one or more of conductive metal nitride (e.g., titanium nitride or tantalum nitride) and metal (e.g., titanium, tantalum, tungsten, copper, or aluminum). The buried gate capping layer 305 may be formed on the buried gate insulating layer 301 and the buried gate conductive layer 303. In some embodiments, the buried gate capping layer 305 may include, for example, one or more of a silicon oxide layer, a silicon nitride layer, and a silicon oxnitride layer. The top surface of the buried gate capping layer 305 and the top surface of the isolation layer 103 may be substantially coplanar.

Figure 41:
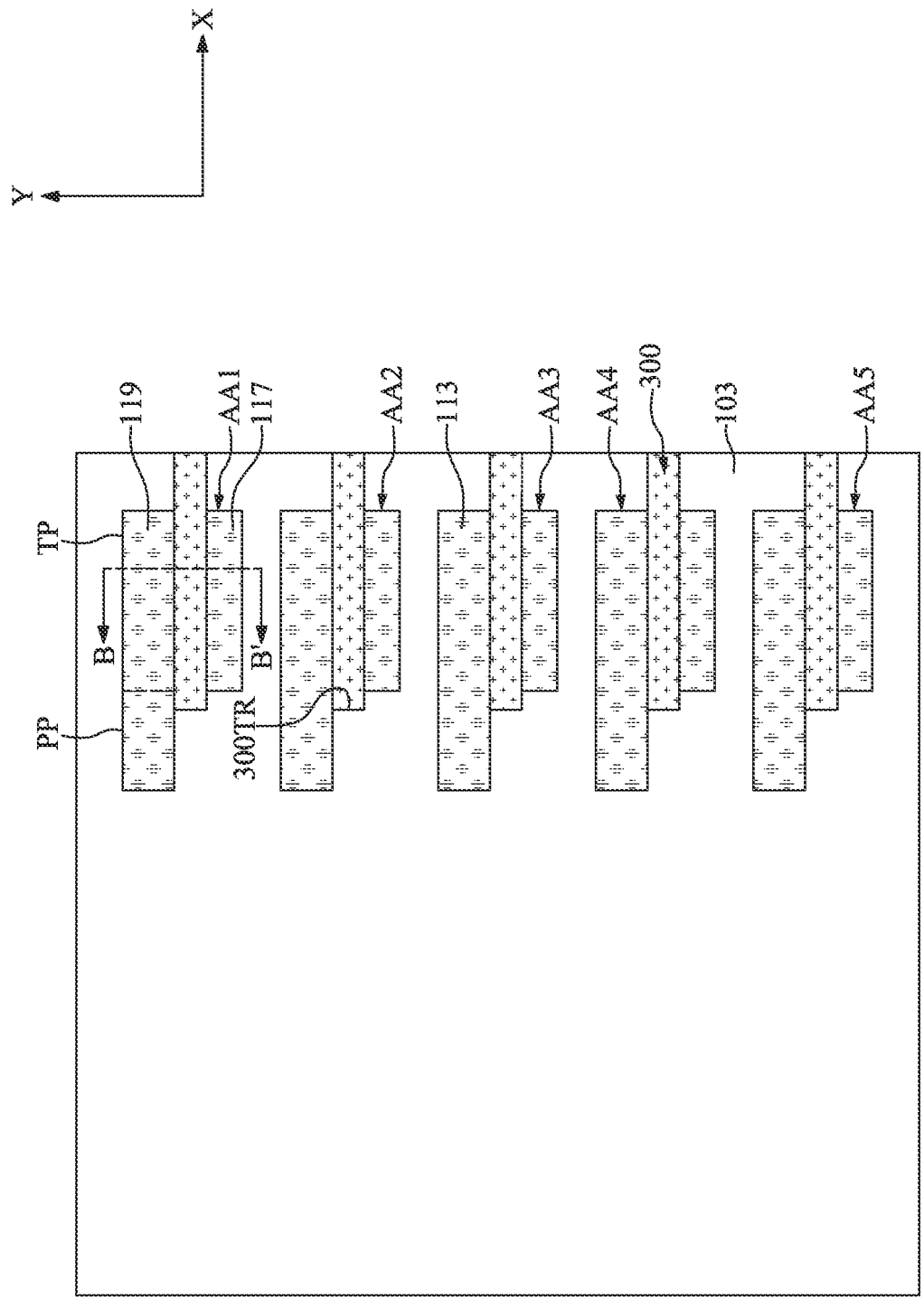
FIG. 41 illustrates, in a schematic top-view diagram, an intermediate semiconductor device in accordance with another embodiment of the present disclosure.
Figure 42:
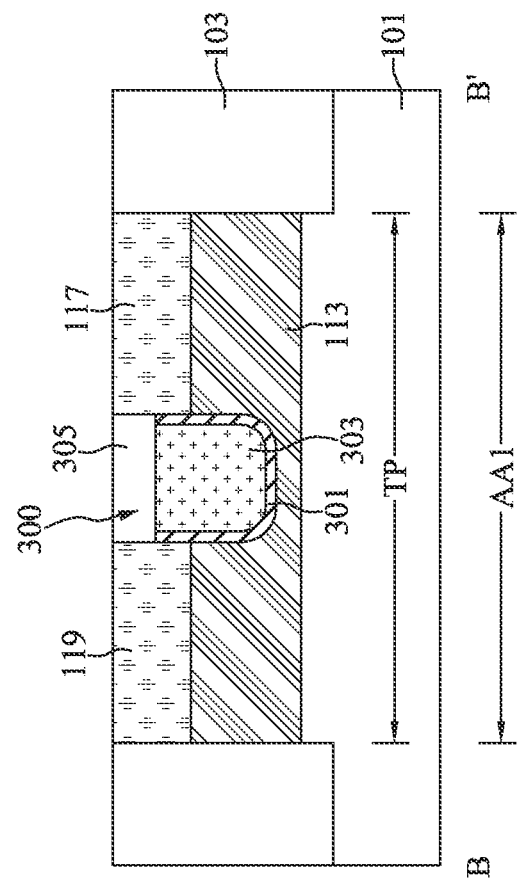
FIG. 42 is a schematic cross-sectional view diagram taken along the line B-B' in FIG. 41 illustrating part of the flow for fabricating the semiconductor device in accordance with another embodiment of the present disclosure.

FIG. 41 illustrates, in a schematic top-view diagram, an intermediate semiconductor device in accordance with another embodiment of the present disclosure. FIG. 42 is a schematic cross-sectional view diagram taken along the line B-B' in FIG. 41 illustrating part of the flow for fabricating the semiconductor device 1D in accordance with another embodiment of the present disclosure.

With reference to FIGS. 36, 41, and 42, at step S25, a plurality of source regions 117 and a plurality of drain regions 119 may be formed in the plurality of well regions 113.

With reference to FIGS. 41 and 42, a n-type impurity implant process may be performed using the buried gate structures 300 as the masks to form the plurality of source regions 117 in the lower parts of the transistor portions TP of the active areas AA1, AA2, AA3, AA4, AA5 and the plurality of drain regions 119 in the upper parts of the transistor portions TP of the active areas AA1, AA2, AA3, AA4, AA5 and the programmable portions PP of the active areas AA1, AA2, AA3, AA4, AA5. The n-type impurity implant process may be similar to that illustrated in FIGS. 15 to 17, and descriptions thereof are not repeated herein.

For brevity, clarity, and convenience of description, only one source region 117 and one drain region 119 are described.

In some embodiments, the source region 117 and the drain region 119 may have the second electrical type (i.e., the n-type). The dopant concentration of the source region 117 and the drain region 119 may be about 1E19 atoms/cm^3 to about 1E21 atoms/cm^3. In some embodiments, the length L4 of the source region 117 may be less than the length L5 of the drain region 119 in a top-view perspective.

Figure 43:
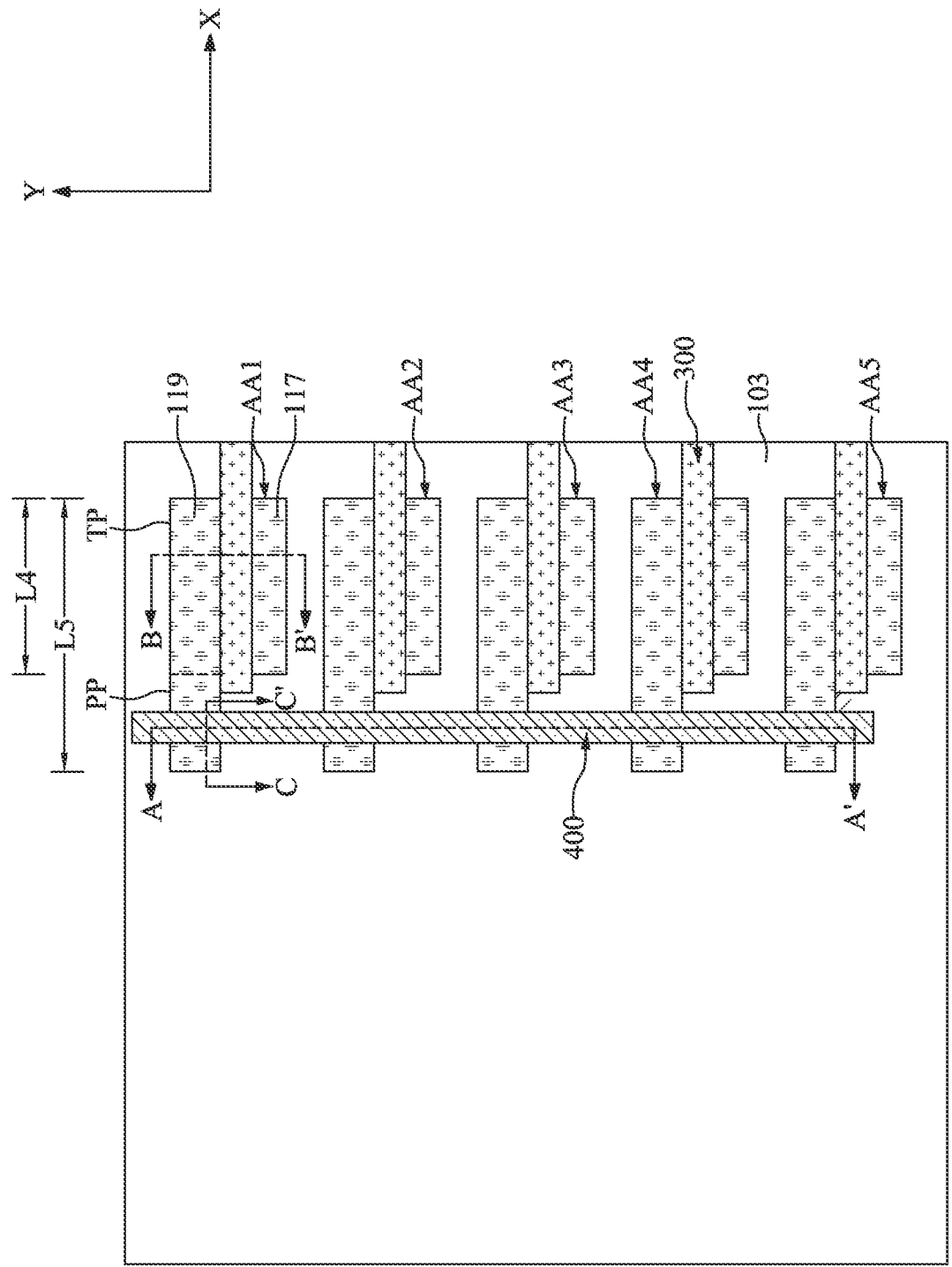
FIG. 43 illustrates, in a schematic top-view diagram, an intermediate semiconductor device in accordance with another embodiment of the present disclosure.
Figure 44:
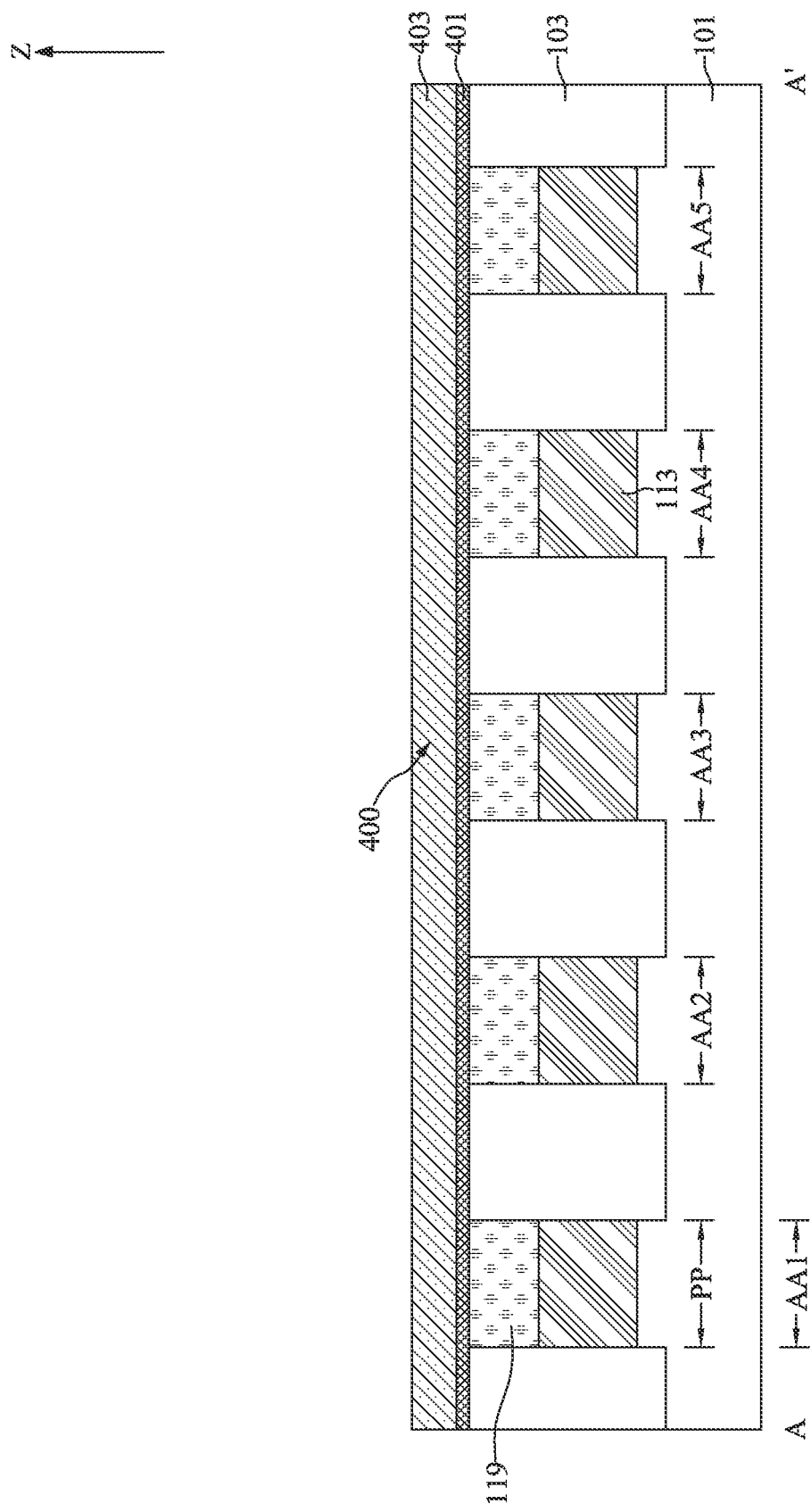
FIGS. 44 to 47 are schematic cross-sectional view diagrams taken along the lien A-A', the line B-B', and the line C-C' in FIG. 43 illustrating part of the flow for fabricating the semiconductor device in accordance with another embodiment of the present disclosure.
Figure 45:
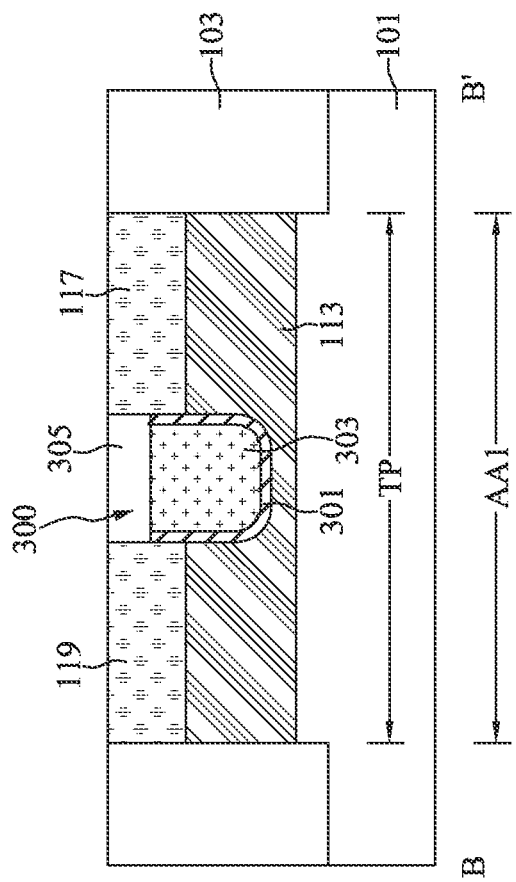

FIG. 43 illustrates, in a schematic top-view diagram, an intermediate semiconductor device in accordance with another embodiment of the present disclosure. FIGS. 44 to 47 are schematic cross-sectional view diagrams taken along the lien A-A', the line B-B', and the line C-C' in FIG. 43 illustrating part of the flow for fabricating the semiconductor device 1D in accordance with another embodiment of the present disclosure.

With reference to FIG. 36 and FIGS. 43 to 46, at step S27, a middle insulating layer 401 may be formed on the plurality of active areas AA1, AA2, AA3, AA4, AA5, an upper conductive layer 403 may be formed on the middle insulating layer 401, wherein the middle insulating layer 401, the upper conductive layer 403, and the plurality of drain regions 119 together configure a plurality of programmable structures 400.

With reference to FIGS. 43 to 46, the middle insulating layer 401 may extend along the direction Y and may be formed on the drain regions 119. The middle insulating layer 401 may orthogonally intersect with the drain regions 119. It should be noted that the middle insulating layer 401 is not overlapped with the buried gate structures 300 in a top-view perspective.

In some embodiments, the middle insulating layer 401 may be formed of for example, silicon oxide. In some embodiments, the middle insulating layer 401 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof.

Illustrative examples of high-k dielectric material may include, but are not limited to, hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof.

In some embodiments, the middle insulating layer 401 may be a multilayer structure that includes, for example, one layer of silicon oxide and another layer of high-k dielectric material.

With reference to FIGS. 43 to 46, the upper conductive layer 403 may be formed on the middle insulating layer 401. In some embodiments, the upper conductive layer 403 may be thrilled of, for example, (doped) polycrystalline silicon, (doped) polycrystalline germanium, (doped) polycrystalline silicon germanium, or other suitable conductive material.

With reference to FIGS. 43 to 46, the middle insulating layer 401, the upper conductive layer 403, and a corresponding drain region 119 together configure the programmable structure 400. The programmable structure 400 may be, for example, an anti-fuse. In the present embodiment, the drain region 119 may serve as the lower conductor of the programmable structure 400. The upper conductive layer 403 may serve as the upper conductor of the programmable structure 400. The middle insulating layer 401 may serve as the dielectric layer sandwiched between the lower and the upper conductors.

Figure 47:
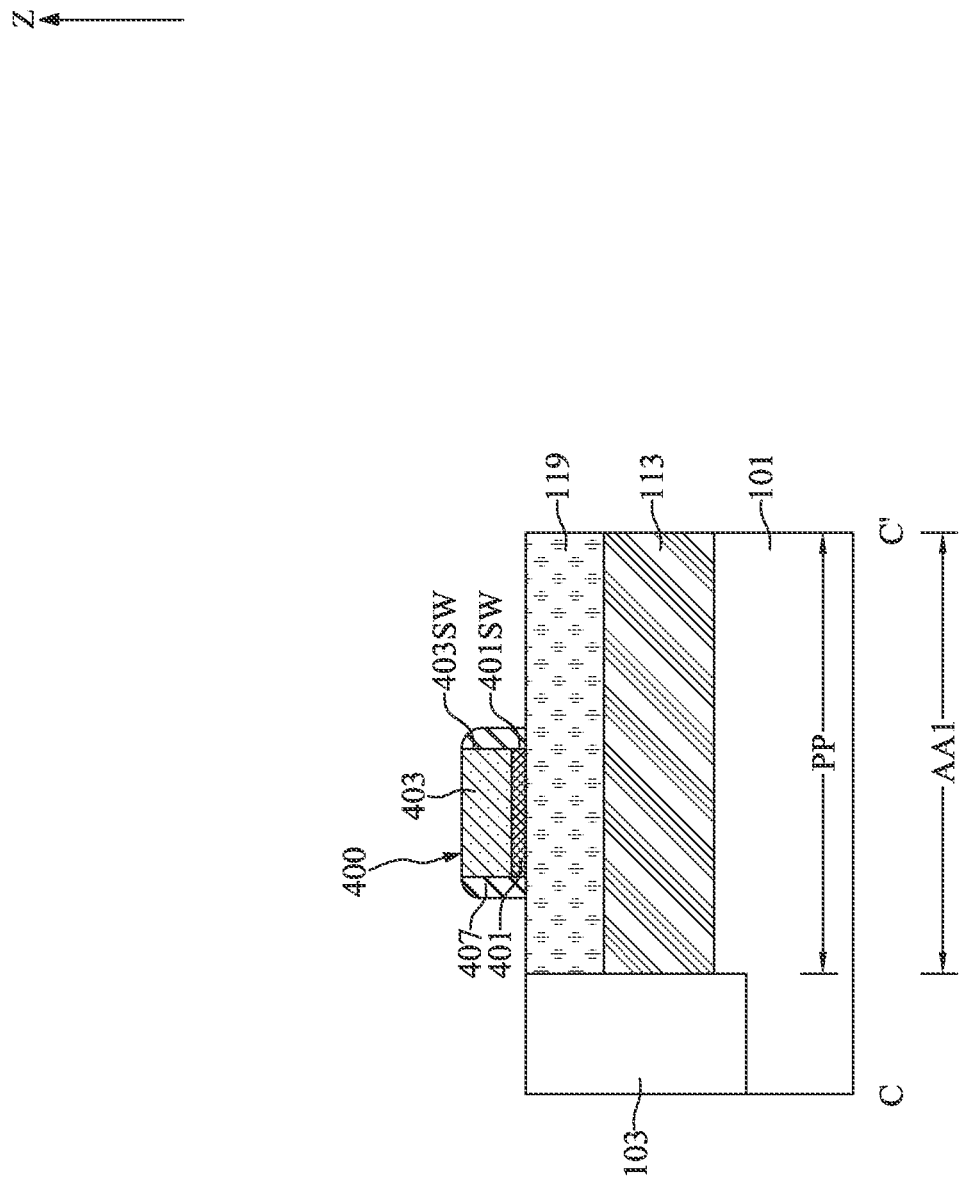

With reference to FIGS. 36 and 47, at step S29, two spacers 407 may be formed on sidewalls 401SW, 403SW of the middle insulating layer 401 and the upper conductive layer 403.

Figure 46:
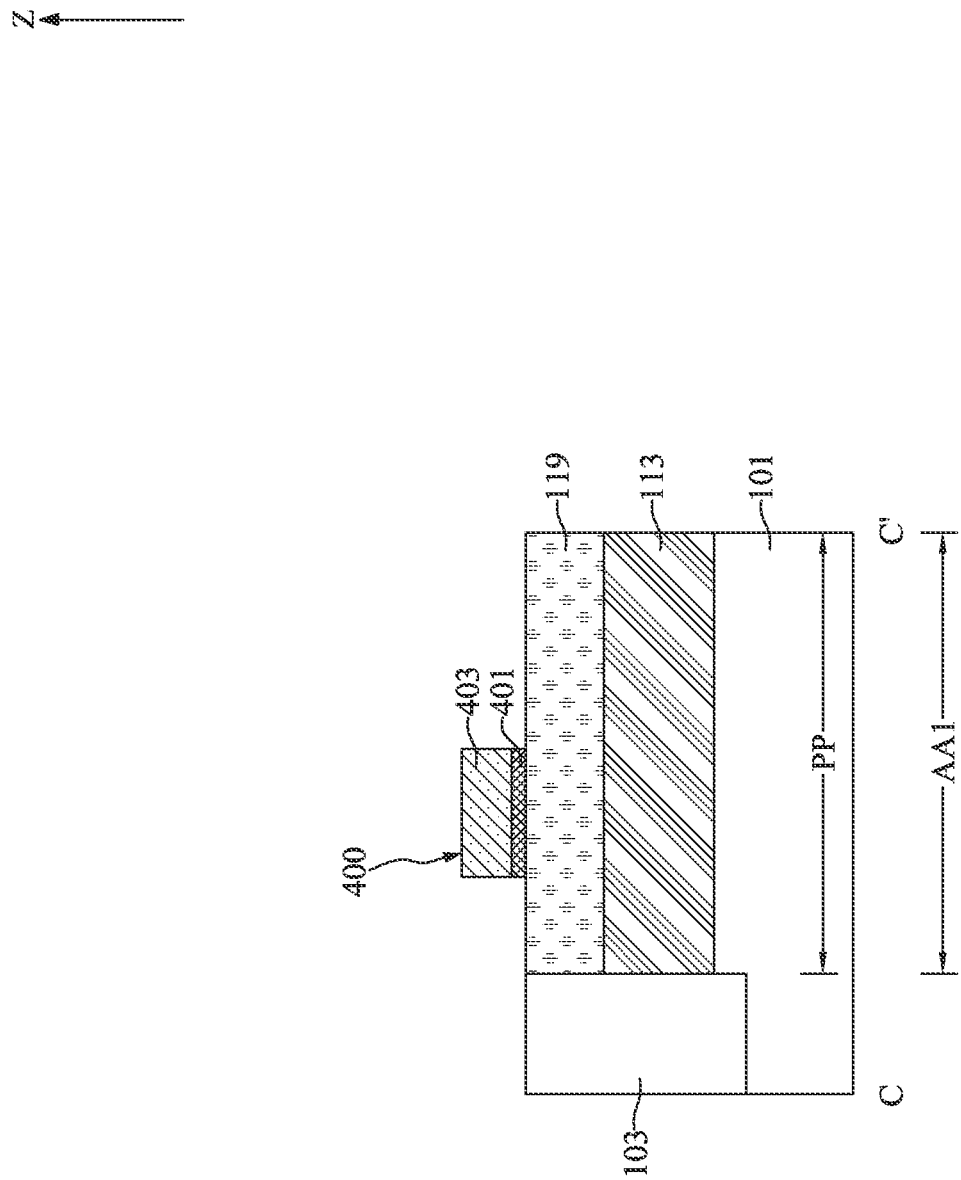

With reference to FIG. 47, a layer of spacer material (not shown) may be conformally formed to cover the intermediate semiconductor device illustrated in FIG. 46. In some embodiments, the spacer material may be, for example, silicon oxide, silicon nitride, oxynitride, silicon nitride oxide, or other suitable insulating material. In some embodiments, the spacer material may include an energy-removable material. The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source. The base material may include a methylsilsesquioxane based material. The decomposable porogen material may include a porogen organic compound that provides porosity to the base material of the energy-removable material.

With reference to FIG. 47, an etch process, such as an anisotropic dry etch process, may be performed to remove portions of the spacer material and concurrently form two spacers 407 on the sidewalls 401SW, 403SW of the middle insulating layer 401 and the upper conductive layer 403. In some embodiments, when the spacer material 605 includes of the energy-removable material, an energy treatment may be performed after the etch process by applying an energy source. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable material to generate empty spaces (pores), with the base material remaining in place. The empty spaces (pores) may reduce the dielectric constant of the two spacers 407. As a result, the effect of the parasitic capacitance of the programmable structures 400 to adjacent elements may be reduced.

Figure 48:
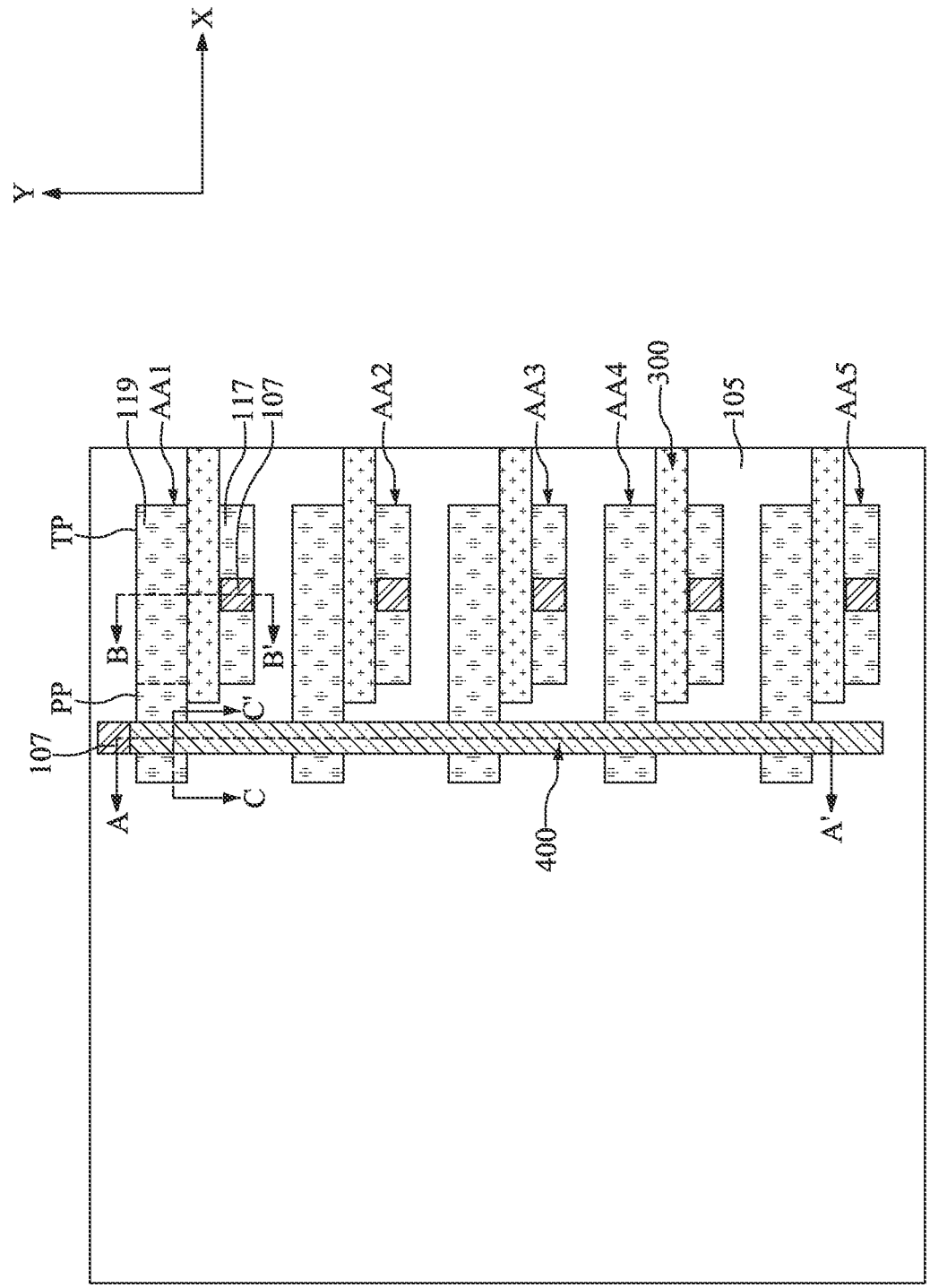
FIG. 48 illustrates, in a schematic top-view diagram, an intermediate semiconductor device in accordance with another embodiment of the present disclosure.
Figure 49:
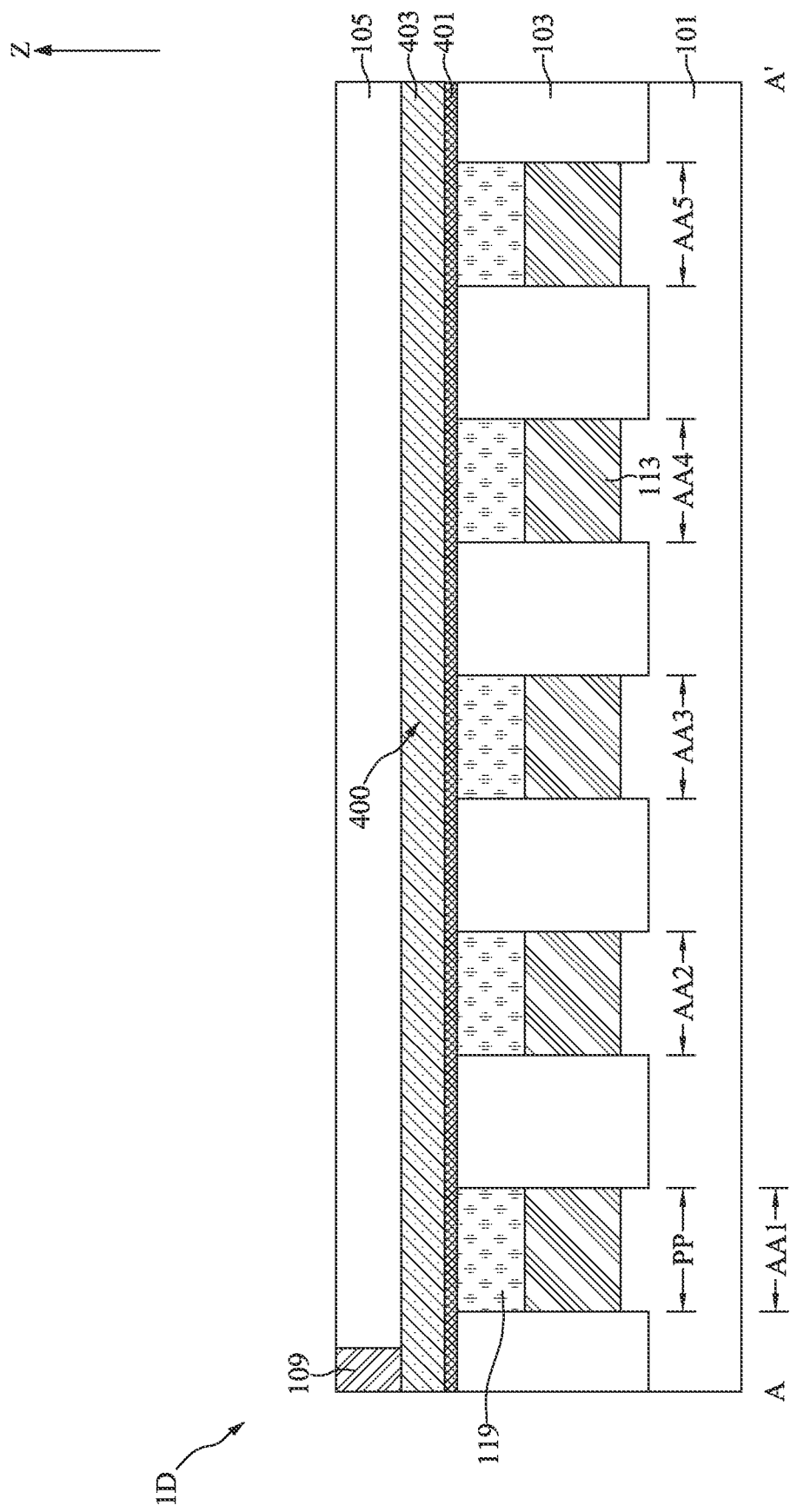
FIGS. 49 to 51 are schematic cross-sectional view diagrams taken along the lien A-A', the line B-B', and the line C-C' in FIG. 48 illustrating part of the flow for fabricating the semiconductor device in accordance with another embodiment of the present disclosure.
Figure 50:
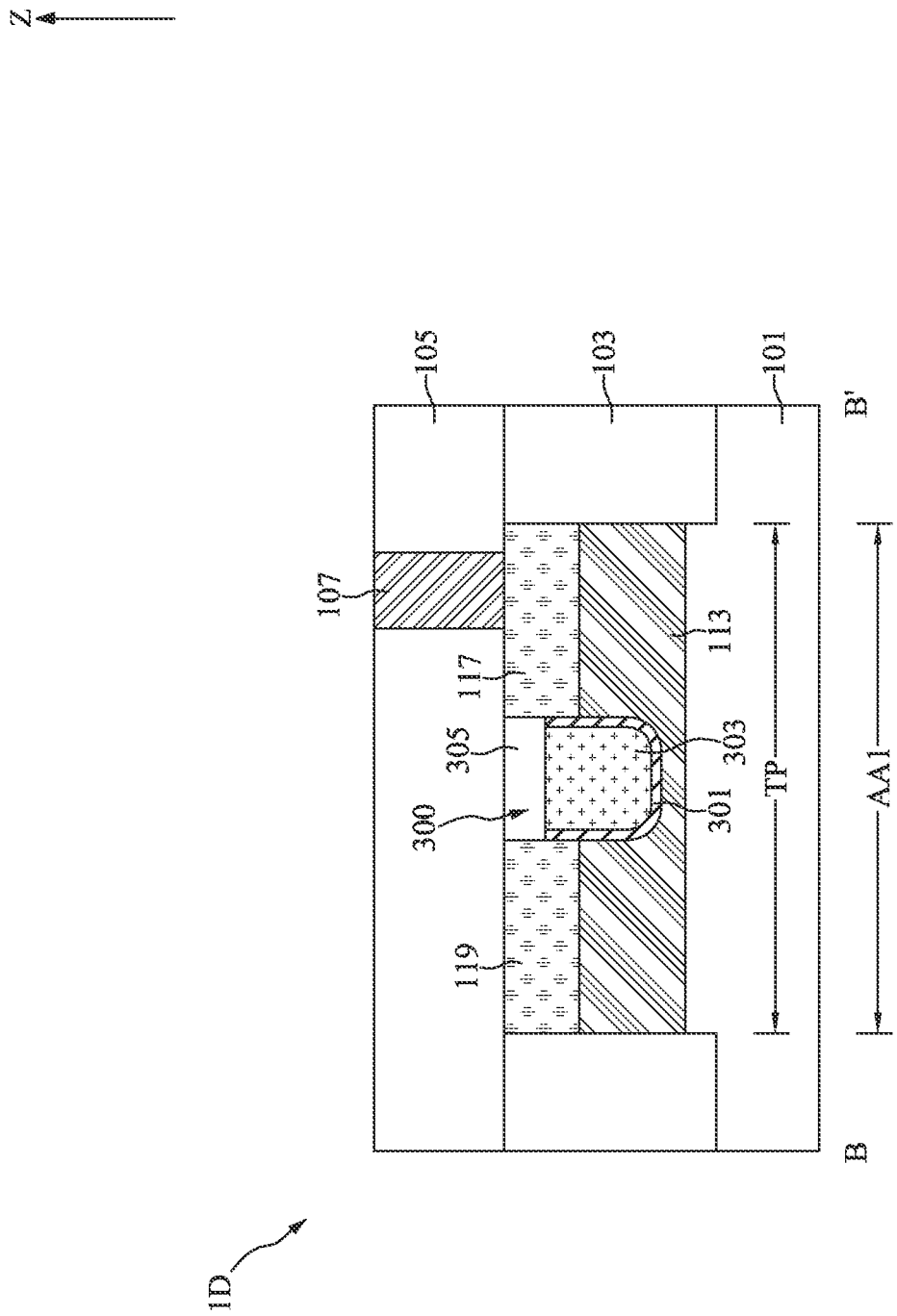
Figure 51:
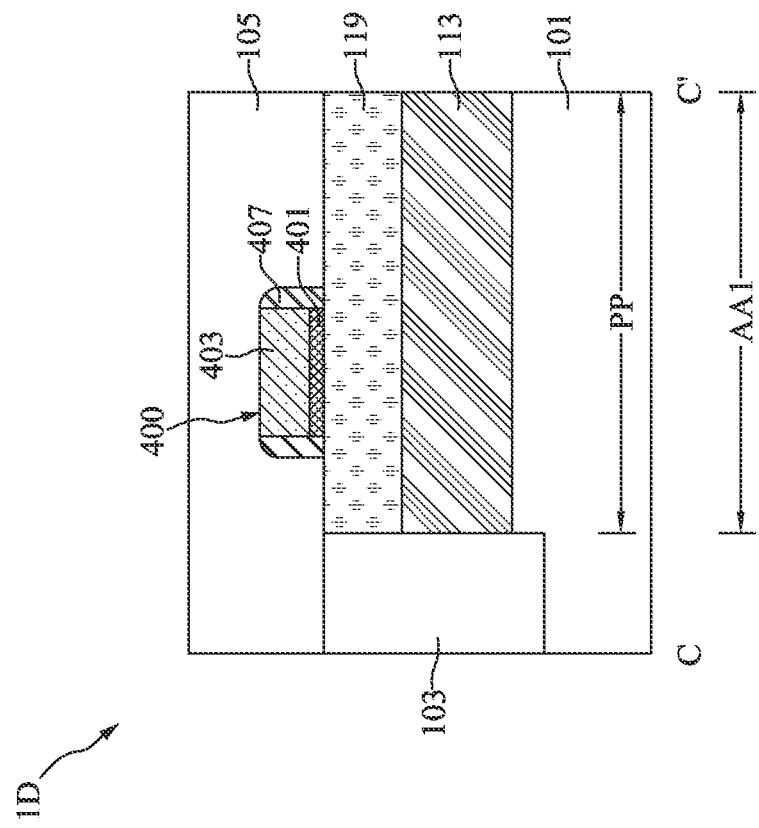

FIG. 48 illustrates, in a schematic top-view diagram, an intermediate semiconductor device in accordance with another embodiment of the present disclosure. FIGS. 49 to 51 are schematic cross-sectional view diagrams taken along the lien A-A', the line B-B', and the line C-C' in FIG. 48 illustrating part of the flow for fabricating the semiconductor device 1D in accordance with another embodiment of the present disclosure.

With reference to FIG. 36 and FIGS. 48 to 51, at step S31, a plurality of first contacts 107 may be formed to electrically connect to the plurality of source regions 117, and a second contact 109 may be thrilled to electrically connect to the upper conductive layer 403.

With reference to FIGS. 48 to 51, the inter-dielectric layer 105, the first contact 107, and the second contact 109 may be formed with a procedure similar to that illustrated in FIGS. 27 to 29, and descriptions thereof are not repeated herein.

When programming the programmable structure 400, a high voltage (e.g., ±6.0 volts) may be applied to the upper conductive layer 403 through the second contact 109, a selection voltage (e.g., +1.5 volts) may be applied to the buried gate structure 300, and the first contact 107 may be grounded, the middle insulating layer 401 sandwiched by the upper conductive layer 403 and the drain region 119 may be stressed under the programming voltage. As a result, the sandwiched portion of the middle insulating layer 401 will be ruptured to form a contiguous path connecting the upper conductive layer 403 and the drain region 119. In other words, the sandwiched portion of the middle insulating layer 401 may be blown out and the programmable structure 400 is programmed.

It should be noted that all the drains 119 can be respectively incorporated with the middle insulating layer 401 and the upper conductive layer 403 to configure multiple programmable structures 400. The multiple programmable structures 400 may configure a 103 programmable array with a common upper conductor (i.e., the upper conductive layer 403). The selection of programmable structure 400 to be programmed may be achieved by controlling the buried gate structure 300 associated with the corresponding drain region 119.

The programmable structure 400 integrates the drain region 119 associated with the buried gate structure 300 as the lower conductor so that the occupied area of the programmable structure 400 may be reduced. Therefore, more area may be available for other sophisticated functional units or more programmable structures 400. As a result, the performance of the semiconductor device 1D may be improved. In addition, the buried gate structure 300 associated with the programmable structure 400 may also serve as an isolation transistor to isolate the high programming voltage to adjacent elements. Therefore, the damage to the adjacent elements by the high programming voltage (e.g., the leakage current originated from the high programming voltage) may be reduced. The reliability of the semiconductor device 1D may be improved, accordingly.

Figure 52:
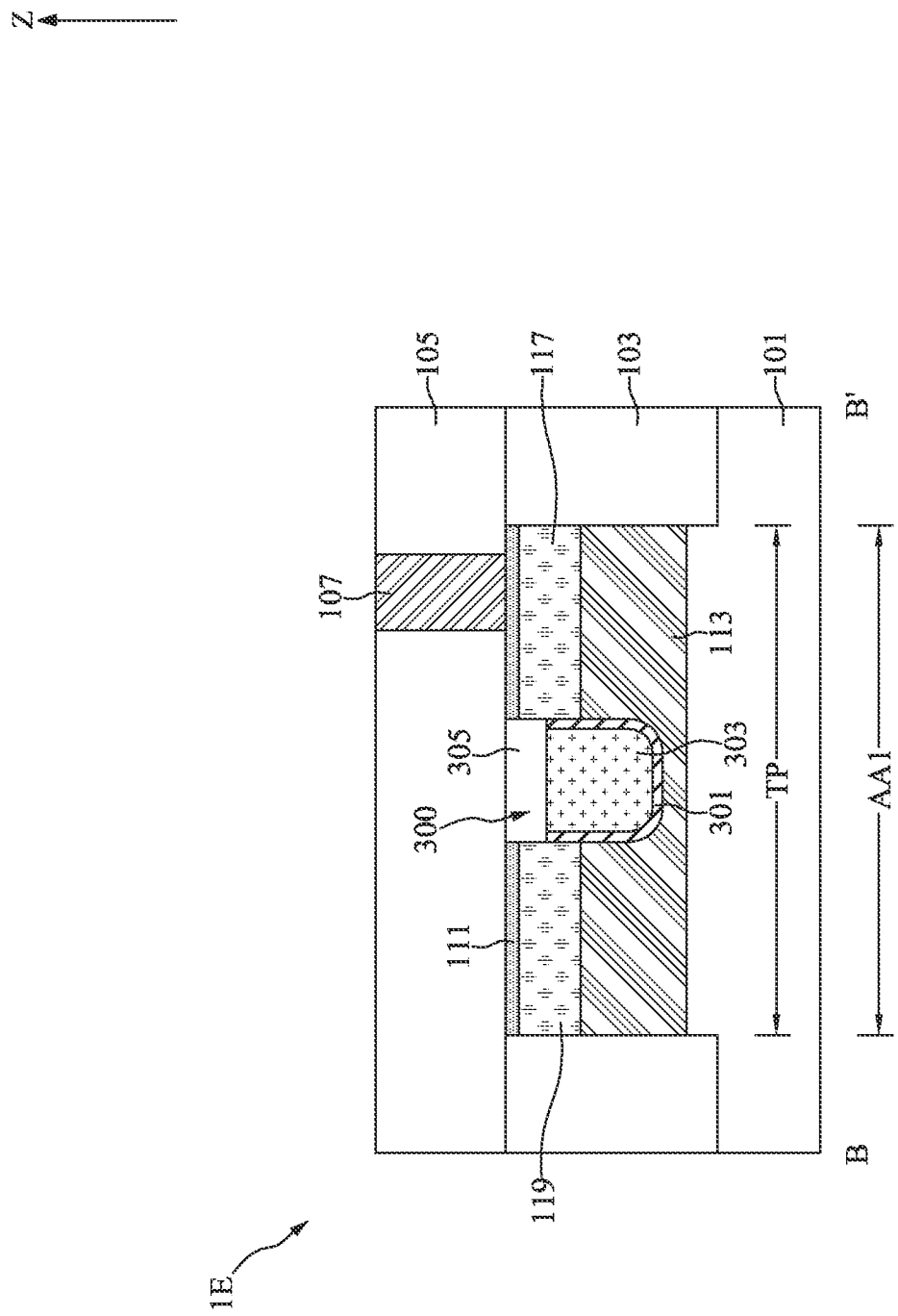
FIGS. 52 and 53 illustrate, in schematic cross-sectional view diagrams, a semiconductor device in accordance another embodiment of the present disclosure.
Figure 53:
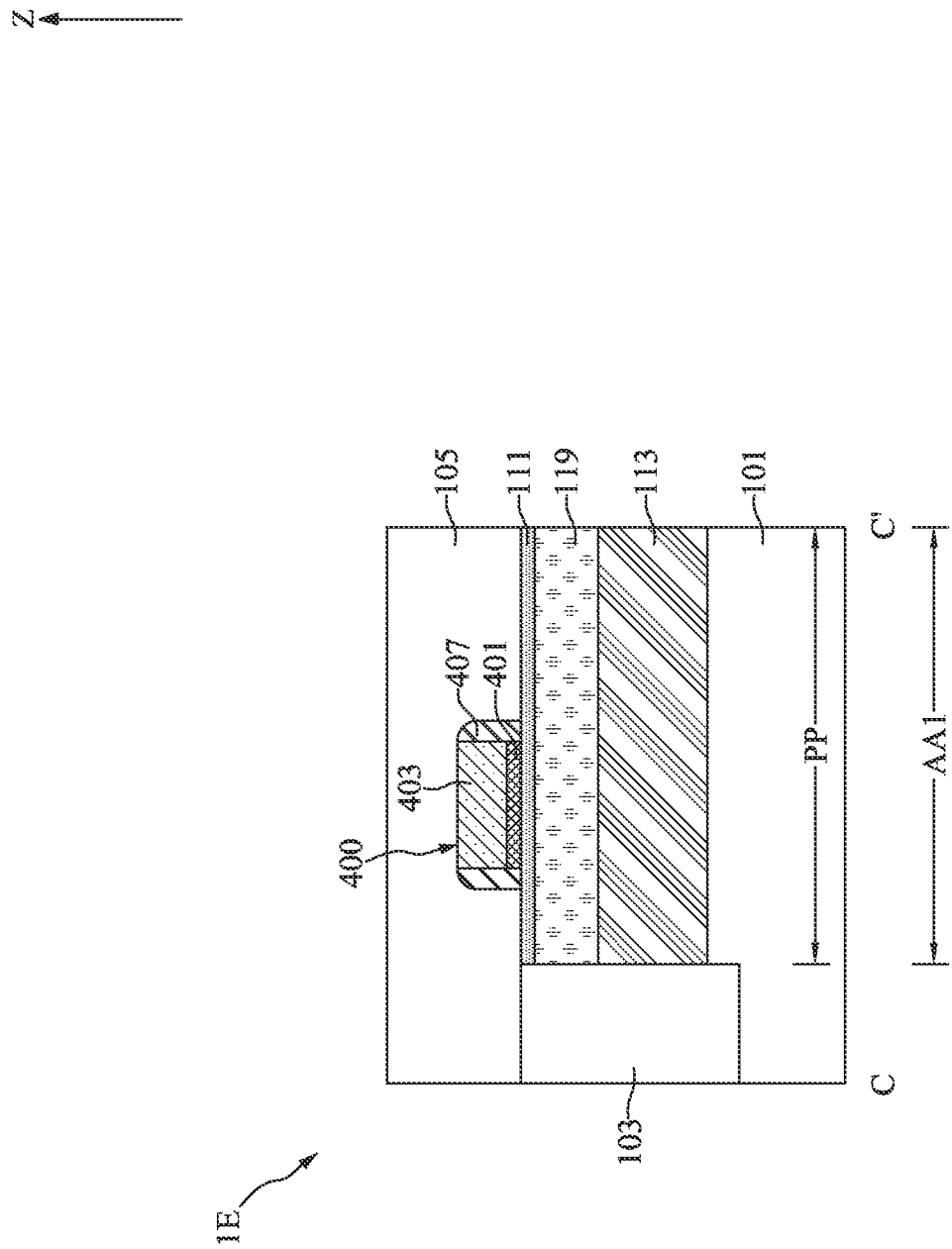

FIGS. 52 and 53 illustrate, in schematic cross-sectional view diagrams, a semiconductor device 1E in accordance another embodiment of the present disclosure.

With reference to FIGS. 52 and 53, a plurality of intervening layers 111 may be disposed between the source regions 117 and the first contacts 107, between the drain regions 119 and the middle insulating layer 401, and between the drain regions 119 and the inter-dielectric layer 105. The plurality of intervening layers 111 may include titanium silicide, nickel silicide, nickel platinum silicide, tantalum silicide, or cobalt silicide. In some embodiments, the thickness of the plurality of intervening layers 111 may be between about 2 nanometers and about 20 nanometers.

One aspect of the present disclosure provides a semiconductor device including a substrate; an isolation layer positioned in the substrate and defining an active area of the substrate, wherein the active area includes a transistor portion and a programmable portion extending from the transistor portion; a gate structure positioned on the transistor portion; a drain region positioned in the programmable portion and the transistor portion, and adjacent to the gate structure; a source region positioned in the transistor portion, adjacent to the gate structure, and opposite to the drain region with the gate structure interposed therebetween; a middle insulating layer positioned on the programmable portion; and an upper conductive layer positioned on the middle insulating layer. The drain region in the programmable portion, the middle insulating layer, and the upper conductive layer together configure a programmable structure.

Another aspect of the present disclosure provides a semiconductor device including a substrate; an isolation layer positioned in the substrate and defining an active area of the substrate, wherein the active area includes a transistor portion and a programmable portion extending from the transistor portion; a buried gate structure positioned in the transistor portion; a drain region positioned in the programmable portion and the transistor portion, and adjacent to the gate structure; a source region positioned in the transistor portion, adjacent to the gate structure, and opposite to the drain region with the buried gate structure interposed therebetween; a middle insulating layer positioned on the programmable portion; and an upper conductive layer positioned on the middle insulating layer. The drain region in the programmable portion, the middle insulating layer, and the upper conductive layer together configure a programmable structure.

Another aspect of the present disclosure provides a method for fabricating a semiconductor device including providing a substrate; forming an isolation layer in the substrate to define an active area of the substrate, wherein the active area includes a transistor portion and a programmable portion extending from the transistor portion; forming a gate structure on the transistor portion; forming a drain region in the programmable portion and the transistor portion, and adjacent to the gate structure; forming a source region in the transistor portion, adjacent to the gate structure, and opposite to the drain region; forming a middle insulating layer on the programmable portion; and forming an upper conductive layer on the middle insulating layer. The drain region in the programmable portion, the middle insulating layer, and the upper conductive layer together configure a programmable structure.

Another aspect of the present disclosure provides a method for fabricating a semiconductor device including providing a substrate; forming an isolation layer in the substrate to define an active area of the substrate, wherein the active area includes a transistor portion and a programmable portion extending from the transistor portion; forming a buried gate structure in the transistor portion; forming a drain region in the programmable portion and the transistor portion, and adjacent to the gate structure; forming a source region in the transistor portion, adjacent to the gate structure, and opposite to the drain region; forming a middle insulating layer on the programmable portion; and forming an upper conductive layer on the middle insulating layer. The drain region in the programmable portion, the middle insulating layer, and the upper conductive layer together configure a programmable structure.

Due to the design of the semiconductor device of the present disclosure, the programmable structure 400 integrates the drain region 119 associated with the gate structure 200 as the lower conductor so that the occupied area of the programmable structure 400 may be reduced. Therefore, more area may be available for other sophisticated functional units or more programmable structures 400. As a result, the performance of the semiconductor device 1A may be improved. In addition, the gate structure 200 associated with the programmable structure 400 may also serve as an isolation transistor to isolate the high programming voltage to adjacent elements. Therefore, the damage to the adjacent elements by the high programming voltage (e.g., the leakage current originated from the high programming voltage) may be reduced. The reliability of the semiconductor device 1A may be improved, accordingly.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate;
   forming an isolation layer in the substrate to define an active area of the substrate, wherein the active area comprises a transistor portion and a programmable portion extending from the transistor portion;
   forming a gate structure on the transistor portion;
   forming a drain region in the programmable portion and the transistor portion, and adjacent to the gate structure;
   forming a source region in the transistor portion, adjacent to the gate structure, and opposite to the drain region;
   forming a middle insulating layer on the programmable portion; and
   forming an upper conductive layer on the middle insulating layer;
   wherein the drain region in the programmable portion, the middle insulating layer, and the upper conductive layer together configure a programmable structure;
   wherein a length of the source region is less than a length of the drain region in a top-view perspective, a length of the gate structure is greater than or equal to a length of the source region, and a width of the programmable portion is less than a width of the transistor portion.

2. The method of claim 1, further comprising: forming a first contact on the source region and electrically connected to the source region.

3. The method of claim 2, further comprising: forming a second contact on the upper conductive layer and electrically connected to the upper conductive layer.

4. The method of claim 3, further comprising: forming two gate spacers respectively on the source region and the drain region, and covering sidewalls of the gate structure.

5. The method of claim 4, further comprising: forming a light doping region in the substrate, under one of two the gate spacers, and adjacent to the drain region, wherein the drain region and the light doping region comprise the same electrical type.

6. The method of claim 5, further comprising: forming a well region in the transistor portion and the programmable portion; wherein the light doping region, the source region, and the drain region are positioned in the well region, and the well region and the drain region comprise different electrical types.

7. The method of claim 6, further comprising: forming an intervening layer between the first contact and the source region; wherein the intervening layer comprises titanium silicide, nickel silicide, nickel platinum silicide, tantalum silicide, or cobalt silicide.

8. The method of claim 6, further comprising: forming an intervening layer on the drain region; wherein the intervening layer comprises titanium silicide, nickel silicide, nickel platinum silicide, tantalum silicide, or cobalt silicide.

9. The method of claim 6, further comprising: forming an intervening layer between the middle insulating layer and the drain region; wherein the intervening layer comprises titanium silicide, nickel silicide, nickel platinum silicide, tantalum silicide, or cobalt silicide.

10. The method of claim 6, further comprising: forming an intervening layer on the gate conductive layer; wherein the intervening layer comprises titanium silicide, nickel silicide, nickel platinum silicide, tantalum silicide, or cobalt silicide.

11. The method of claim 1, further comprising: forming a first connecting pad connecting to one end of the programmable structure;
   forming a bottom insulating layer extending from the middle insulating layer and positioned on the substrate; and
   forming a top conductive layer extending from the upper conductive layer positioned on the bottom insulating layer.

* * * * *